United States Patent
Mokhlesi et al.

(10) Patent No.: US 7,310,272 B1
(45) Date of Patent: Dec. 18, 2007

(54) SYSTEM FOR PERFORMING DATA PATTERN SENSITIVITY COMPENSATION USING DIFFERENT VOLTAGE

(75) Inventors: Nima Mokhlesi, Los Gatos, CA (US); Yingda Dong, Sunnyvale, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/421,884

(22) Filed: Jun. 2, 2006

(51) Int. Cl.
*G11C 16/06* (2006.01)
*G11C 16/04* (2006.01)

(52) U.S. Cl. .................. 365/185.22; 365/185.02; 365/185.18; 365/185.21; 365/185.23; 365/185.24

(58) Field of Classification Search ........... 365/185.02, 365/185.18, 185.21, 185.22, 185.23, 185.24
See application file for complete search history.

(56) References Cited

U.S. PATENT DOCUMENTS

| | | | |
|---|---|---|---|
| 5,124,945 A * | 6/1992 | Schreck | ........... 365/185.22 |
| 5,532,962 A | 7/1996 | Auclair | |
| 5,539,960 A | 7/1996 | Talreja | |
| 5,657,332 A | 8/1997 | Auclair | |
| 5,764,572 A | 6/1998 | Hammick | |
| 5,862,074 A | 1/1999 | Park | |
| 5,867,429 A | 2/1999 | Chen | |
| 5,943,260 A | 8/1999 | Hirakawa | |
| 5,946,231 A | 8/1999 | Endoh | |
| 6,044,019 A | 3/2000 | Cernea | |
| 6,046,935 A | 4/2000 | Takeuchi | |
| 6,154,157 A | 11/2000 | Wong | |
| 6,160,739 A | 12/2000 | Wong | |
| 6,175,522 B1 | 1/2001 | Fang | |
| 6,181,599 B1 | 1/2001 | Gongwer | |

(Continued)

FOREIGN PATENT DOCUMENTS

EP 01271553 1/2003

(Continued)

OTHER PUBLICATIONS

U.S. Appl. No. 60/791,365, filed Apr. 12, 2006, Reducing the Impact of Program Disturb for a Word Line, by Gerrit Jan Hemink.

(Continued)

*Primary Examiner*—Amir Zarabian
*Assistant Examiner*—Ly Duy Pham
(74) *Attorney, Agent, or Firm*—Vierra Magen Marcus & DeNiro LLP

(57) ABSTRACT

Errors can occur when reading the threshold voltage of a programmed non-volatile storage element due to at least two mechanisms: (1) capacitive coupling between neighboring floating gates and (2) changing conductivity of the channel area after programming (referred to as back pattern effect). To account for coupling between neighboring floating gates, the read process for a particular memory cell will provide compensation to an adjacent memory cell in order to reduce the coupling effect that the adjacent memory cell has on the particular memory cell. To account for the back pattern effect, a first voltage is used during a verify operation for unselected word lines that have been subjected to a programming operation and a second voltage is used for unselected word lines that have not been subjected to a programming operation. The combination of these two techniques provides for more accurate storage and retrieval of data.

9 Claims, 24 Drawing Sheets

U.S. PATENT DOCUMENTS

| | | | |
|---|---|---|---|
| 6,222,762 B1 | 4/2001 | Guterman |
| 6,259,632 B1 | 7/2001 | Khouri |
| 6,285,593 B1 | 9/2001 | Wong |
| 6,345,000 B1 | 2/2002 | Wong |
| 6,456,528 B1 | 9/2002 | Chen |
| 6,462,988 B1 | 10/2002 | Harari |
| 6,504,762 B1 | 1/2003 | Harari |
| 6,522,580 B2 | 2/2003 | Chen |
| 6,532,556 B1 | 3/2003 | Wong |
| 6,535,423 B2 | 3/2003 | Trivedi |
| 6,542,407 B1 | 4/2003 | Chen |
| 6,570,785 B1 | 5/2003 | Mangan |
| 6,570,790 B1 | 5/2003 | Harari |
| 6,614,070 B1 | 9/2003 | Hirose |
| 6,643,188 B2 | 11/2003 | Tanaka |
| 6,657,891 B1 | 12/2003 | Shibata |
| 6,717,847 B2 | 4/2004 | Chen |
| 6,717,851 B2 | 4/2004 | Mangan |
| 6,760,068 B2 | 7/2004 | Petropoulos |
| 6,771,536 B2 | 8/2004 | Li |
| 6,781,877 B2 | 8/2004 | Cernea |
| 6,807,095 B2 | 10/2004 | Chen |
| 6,859,397 B2 | 2/2005 | Lutze |
| 6,870,766 B2 | 3/2005 | Cho |
| 6,870,768 B2 | 3/2005 | Cernea |
| 6,888,758 B1 | 5/2005 | Hemink |
| 6,956,770 B2 | 10/2005 | Khalid |
| 7,009,881 B2 | 3/2006 | Noguchi |
| 7,020,017 B2 | 3/2006 | Chen |
| 7,170,788 B1 | 1/2007 | Wan |
| 2002/0051383 A1 | 5/2002 | Mangan |
| 2003/0112663 A1 | 6/2003 | Quader |
| 2003/0128586 A1 | 7/2003 | Chen |
| 2003/0137888 A1 | 7/2003 | Chen |
| 2003/0161182 A1 | 8/2003 | Li |
| 2003/0218920 A1 | 11/2003 | Harari |
| 2004/0012998 A1 | 1/2004 | Chien |
| 2004/0027865 A1 | 2/2004 | Mangan |
| 2004/0042270 A1 | 3/2004 | Huang |
| 2004/0047182 A1 | 3/2004 | Cernea |
| 2004/0057283 A1 | 3/2004 | Cernea |
| 2004/0057285 A1 | 3/2004 | Cernea |
| 2004/0057287 A1 | 3/2004 | Cernea |
| 2004/0057318 A1 | 3/2004 | Cernea |
| 2004/0060031 A1 | 3/2004 | Cernea |
| 2004/0079988 A1 | 4/2004 | Harari |
| 2004/0109357 A1 | 6/2004 | Cernea |
| 2004/0156241 A1 | 8/2004 | Mokhlesi |
| 2004/0179404 A1 | 9/2004 | Quader |
| 2004/0190337 A1 | 9/2004 | Chen |
| 2004/0213031 A1 | 10/2004 | Hosono |
| 2005/0057967 A1 | 3/2005 | Khalid |
| 2005/0162913 A1 | 7/2005 | Chen |
| 2006/0120161 A1* | 6/2006 | Confalonieri et al. ..... 365/185.22 |
| 2006/0221692 A1 | 10/2006 | Chen |
| 2007/0047314 A1* | 3/2007 | Goda et al. ............. 365/185.18 |
| 2007/0121383 A1* | 5/2007 | Chen et al. ............. 365/185.19 |

FOREIGN PATENT DOCUMENTS

| | | |
|---|---|---|
| EP | 01329898 | 1/2003 |
| WO | 2003025512 | 3/2003 |
| WO | 2006107731 | 10/2006 |

OTHER PUBLICATIONS

U.S. Appl. No. 11/296,055, filed Dec. 6, 2005, Erasing Non-Volatile Memory Using Individual Verification and Additional Erasing of Subsets of Memory Cells, by Hemink.

Office Action, dated Aug. 27, 2007, U.S. Appl. No. 11/421,682, filed Jun. 1, 2006.

U.S. Appl. No. 11/421,871, filed Jun. 2, 2006.

U.S. Appl. No. 11/421,667, filed Jun. 1, 2006.

U.S. Appl. No. 11/421,682, filed Jun. 1, 2006.

Office Action dated, Jul. 7, 2007, U.S. Appl. No. 11/421,682, filed Jun. 1, 2006.

Office Action dated, Sep. 24, 2007, U.S. Appl. No. 11/421,871, filed Jun. 2, 2006.

U.S. Appl. No. 11/377,972, filed Mar. 17, 2006.

U.S. Appl. No. 11/384,057, filed Mar. 17, 2006.

U.S. Appl. No. 11/618,569, filed Dec. 29, 2006.

U.S. Appl. No. 11/618,578, filed Dec. 29, 2006.

* cited by examiner

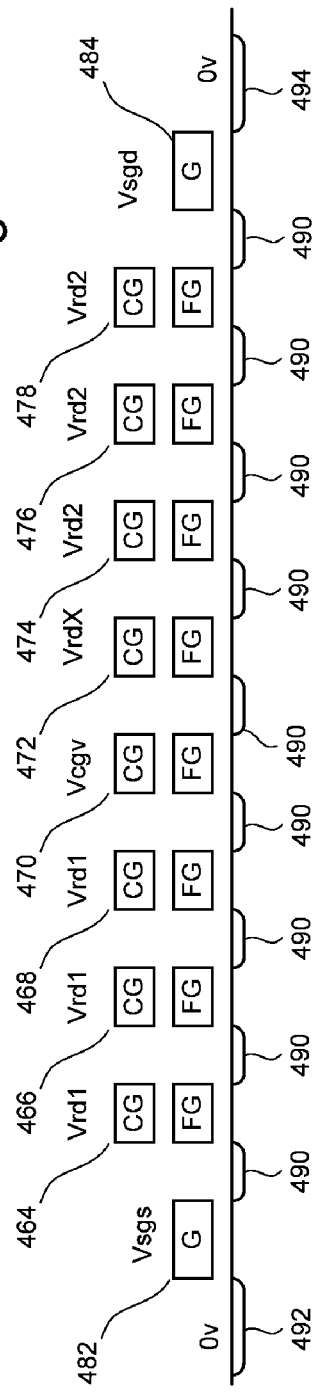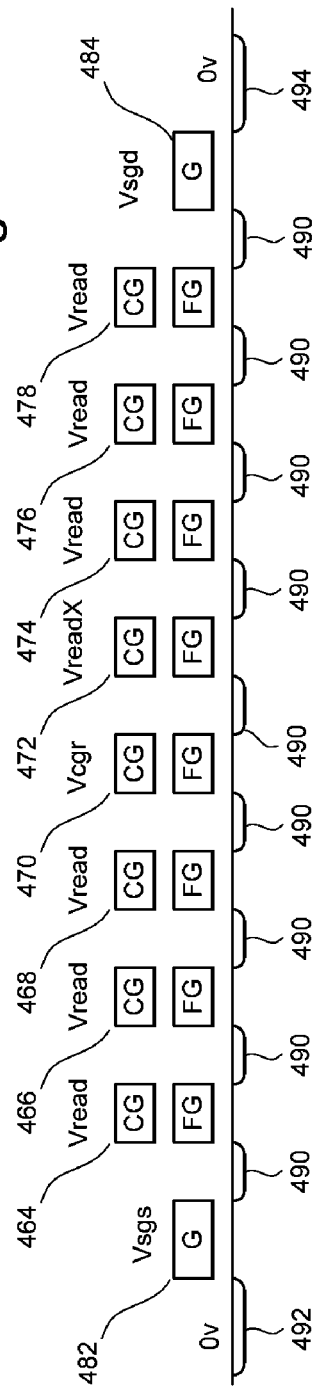

| Wordline | all bit lines |
|---|---|
| WL3 | Page 3 |
| WL2 | Page 2 |
| WL1 | Page 1 |
| WL0 | Page 0 |

Fig. 14A

| Wordline | Even Bit Lines | Odd Bit Lines |
|---|---|---|
| WL3 | Page 6 | Page 7 |
| WL2 | Page 4 | Page 5 |
| WL1 | Page 2 | Page 3 |
| WL0 | Page 0 | Page 1 |

Fig. 14B

| Wordline | Upper/ Lower Page | All Bit Lines |
|---|---|---|
| WL3 | upper | Page 7 |
|  | lower | Page 6 |
| WL2 | upper | Page 5 |
|  | lower | Page 4 |
| WL1 | upper | Page 3 |
|  | lower | Page 2 |
| WL0 | upper | Page 1 |
|  | lower | Page 0 |

Fig. 14C

| Wordline | Upper/ Lower Page | Even Bit Lines | Odd Bit Lines |
|---|---|---|---|
| WL3 | upper | Page 14 | Page 15 |
|  | lower | Page 12 | Page 13 |
| WL2 | upper | Page 10 | Page 11 |
|  | lower | Page 8 | Page 9 |
| WL1 | upper | Page 6 | Page 7 |
|  | lower | Page 4 | Page 5 |
| WL0 | upper | Page 2 | Page 3 |
|  | lower | Page 0 | Page 1 |

Fig. 14D

| Wordline | Upper/ Lower Page | Even Bit Lines | Odd Bit Lines |
|---|---|---|---|
| WL3 | upper | Page 13 | Page 15 |
|  | lower | Page 12 | Page 14 |
| WL2 | upper | Page 9 | Page 11 |
|  | lower | Page 8 | Page 10 |
| WL1 | upper | Page 5 | Page 7 |
|  | lower | Page 4 | Page 6 |
| WL0 | upper | Page 1 | Page 3 |
|  | lower | Page 0 | Page 2 |

Fig. 14E

| Wordline | Upper/ Lower Page | All Bit Lines |
|---|---|---|
| WL3 | upper | Page 7 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |

Fig. 14F

| Wordline | Upper/ Lower Page | Even Bit Lines | Odd Bit Lines |
|---|---|---|---|
| WL3 | upper | Page 14 | Page 15 |
|  | lower | Page 10 | Page 11 |
| WL2 | upper | Page 12 | Page 13 |
|  | lower | Page 6 | Page 7 |
| WL1 | upper | Page 8 | Page 9 |
|  | lower | Page 2 | Page 3 |
| WL0 | upper | Page 4 | Page 5 |
|  | lower | Page 0 | Page 1 |

Fig. 14G

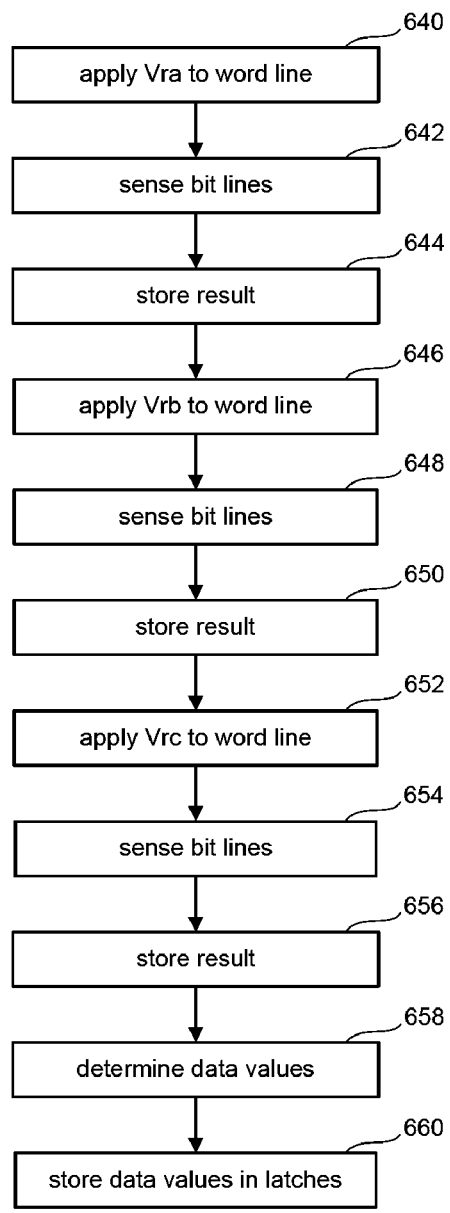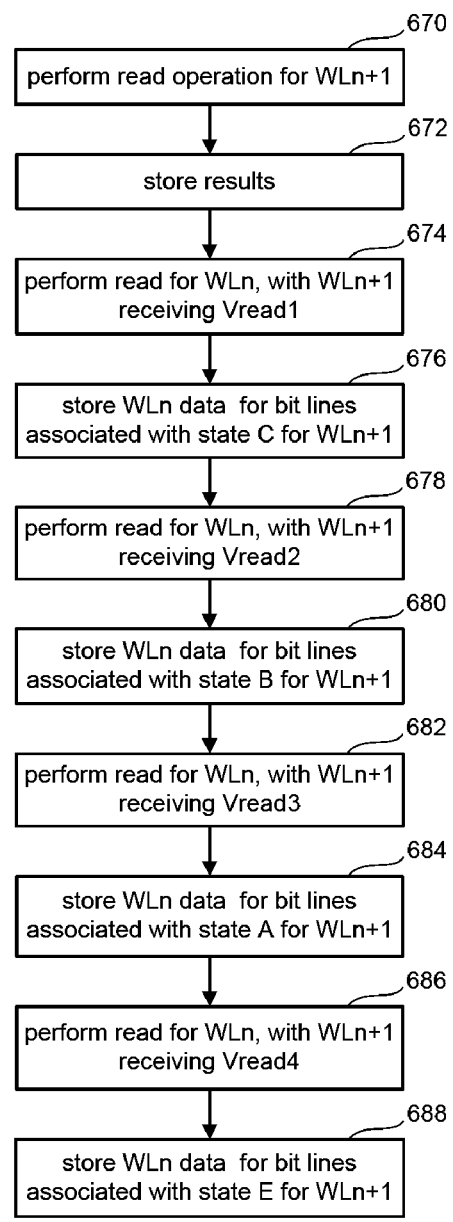

|  | State E | State A | State B | State C |
|---|---|---|---|---|
| (1) Read at Vra | 1 | 0 | 0 | 0 |
| (2) Read at Vrb | 1 | 1 | 0 | 0 |
| (3) (Invert 2) XOR 1 | 1 | 0 | 1 | 1 |
| (4) Read at Vrc | 1 | 1 | 1 | 0 |
| (5) 4 AND 3 | 1 | 0 | 1 | 0 |

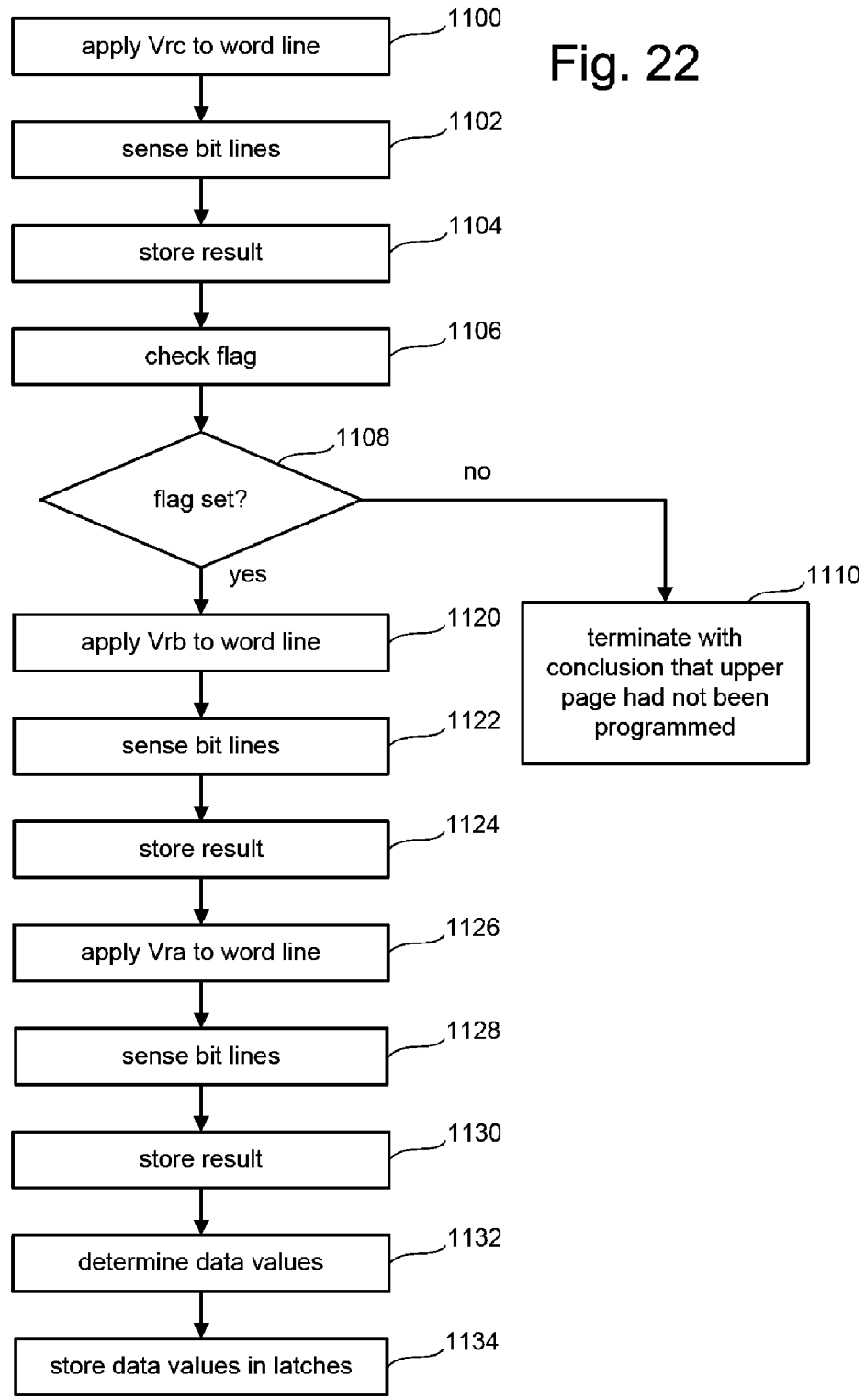

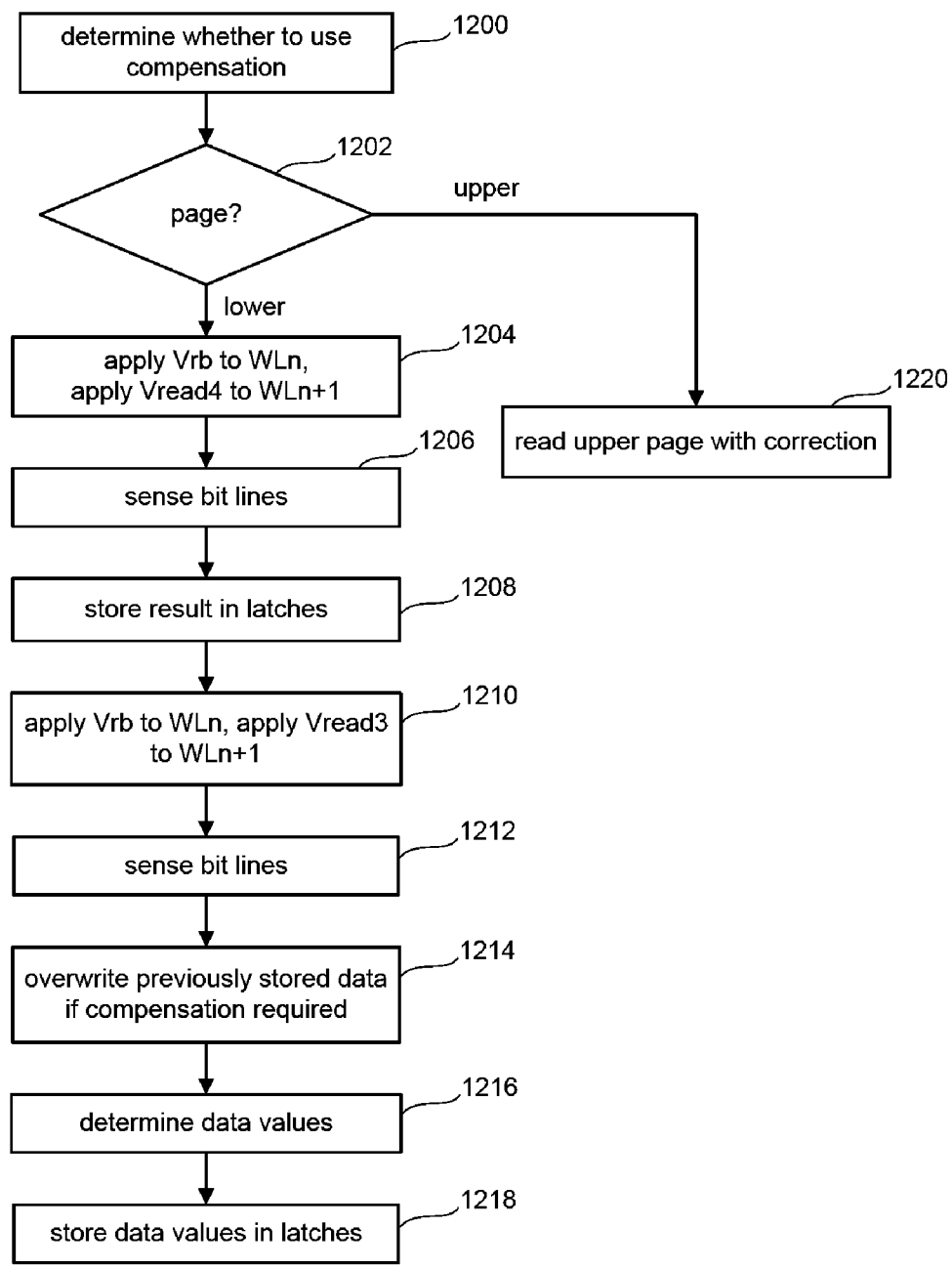

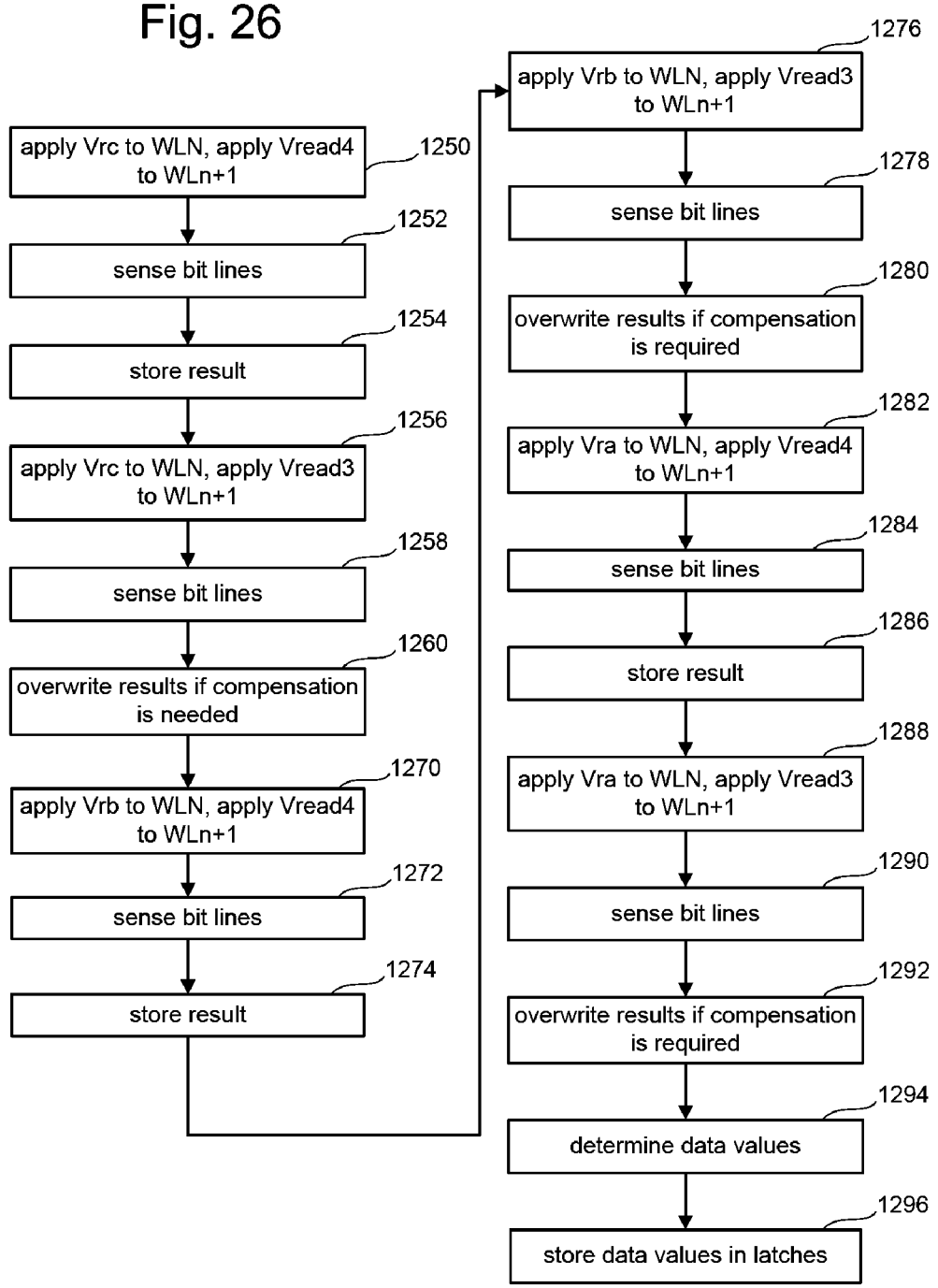

SYSTEM FOR PERFORMING DATA PATTERN SENSITIVITY COMPENSATION USING DIFFERENT VOLTAGE

CROSS-REFERENCE TO RELATED APPLICATIONS

The following application is cross-referenced and incorporated by reference herein in its entirety:

U.S. patent application Ser. No. 11/421,871, entitled "Data Pattern Sensitivity Compensation Using Different Voltage," by Nima Mokhlesi and Yingda Dong, filed the same day as the present application.

U.S. patent application Ser. No. 11/377,972, entitled "System for Performing Read Operation On Non-volatile Storage with Compensation for Coupling," by Nima Mokhlesi, filed on Mar. 17, 2006.

U.S. patent application Ser. No. 11/384,057, entitled "Read Operation for Non-volatile Storage with Compensation for Coupling," by Nima Mokhlesi, filed on Mar. 17, 2006.

U.S. patent application Ser. No. 11/421,667, entitled "Verify Operation For Non-Volatile Storage Using Different Voltages," by Gerrit Jan Hemink, filed on Jun. 1, 2006.

U.S. patent application Ser. No. 11/421,682, entitled "System For Verify Operation For Non-Volatile Storage Using Different Voltages," by Gerrit Jan Hemink, filed on Jun. 1, 2006.

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series between two select gates. The transistors in series and the select gates are referred to as a NAND string.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique for Non-Volatile Memory;" and in U.S. Pat. No. 6,917,542, titled "Detecting Over Programmed Memory;" both patents are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

Errors can occur when reading non-volatile storage element due to at least two mechanisms: (1) capacitive coupling between neighboring floating gates and (2) changing conductivity of the channel area after programming (referred to as back pattern effect). Both of these issues are discussed below.

Shifts in the apparent charge stored on a floating gate can occur because of the coupling of an electric field based on the charge stored in adjacent floating gates. This floating gate to floating gate coupling phenomena is described in U.S. Pat. No. 5,867,429, which is incorporated herein by reference in its entirety. An adjacent floating gate to a target floating gate may include neighboring floating gates that are on the same bit line, neighboring floating gates on the same word line, or floating gates that are diagonal from the target floating gate because they are on both a neighboring bit line and neighboring word line.

The floating gate to floating gate coupling phenomena occurs most pronouncedly between sets of adjacent memory cells that have been programmed at different times. For example, a first memory cell is programmed to add a level of charge to its floating gate that corresponds to one set of data. Subsequently, one or more adjacent memory cells are programmed to add a level of charge to their floating gates that correspond to a second set of data. After the one or more of the adjacent memory cells are programmed, the charge level read from the first memory cell appears to be different than programmed because of the effect of the charge on the adjacent memory cells being coupled to the first memory cell. The coupling from adjacent memory cells can shift the apparent charge level being read a sufficient amount to lead to an erroneous reading of the data stored.

The effect of the floating gate to floating gate coupling is of greater concern for multi-state devices because in multi-state devices the allowed threshold voltage ranges and the forbidden ranges are narrower than in binary devices. Therefore, the floating gate to floating gate coupling can result in memory cells being shifted from an allowed threshold voltage range to a forbidden range.

As memory cells continue to shrink in size, the natural programming and erase distributions of threshold voltages are expected to increase due to short channel effects, greater oxide thickness/coupling ratio variations and more channel dopant fluctuations, reducing the available separation between adjacent states. This effect is much more significant for multi-state memories than memories using only two states (binary memories). Furthermore, the reduction of the space between word lines and of the space between bit lines will also increase the coupling between adjacent floating gates.

Errors can also occur due to the back pattern effect. In a typical NAND flash memory device, memory cells are programmed in a certain order wherein the memory cells on the word line that is next to the source side select gate are programmed first. Subsequently, the memory cells on the adjacent word line are programmed, followed by the programming of memory cells on the next adjacent word line, and so on, until the memory cells on the last word line next to the drain side select gate are programmed.

As more memory cells in a NAND string are programmed, the conductivity of the channel areas under the unselected word lines will decrease because programmed memory cells have a higher threshold voltage than memory cells that are in the erased state. This increasing of channel resistance changes the IV characteristics of the memory cells. When a particular memory cell was being programmed (and verified), all the memory cells on the word lines higher than the selected word line were still in the erased state. Therefore, the channel area under those word lines was conducting very well, resulting in a relatively high cell current during the actual verify operation. However, after all memory cells of the NAND string have been programmed to their desired state, the conductivity of the channel area under those word lines usually decreases as most of the cells will be programmed to one of the programmed states (while a smaller number, on average 25%, will stay in the erased state). As a result, the IV characteristics change since less current will flow than compared to previous verify operation performed during programming. The lowered current causes an artificial shift of the threshold voltages for the memory cells, which can lead to errors when reading data. This effect is referred to as the back pattern effect.

SUMMARY OF THE INVENTION

To account for coupling between neighboring floating gates, the read process for a particular memory cell will provide compensation to an adjacent memory cell in order to reduce the coupling effect that the adjacent memory cell has on the particular memory cell. To account for the back pattern effect, a first voltage is used during a verify operation for unselected word lines that have been subjected to a programming operation and a second voltage is used for unselected word lines that have not been subjected to a programming operation. The combination of these two techniques provides for more accurate storage and retrieval of data.

One embodiment includes applying a particular voltage to a particular non-volatile storage element of a group of connected non-volatile storage elements, applying a first voltage to a first set of one or more non-volatile storage elements of the group, applying a second voltage to a second set of one or more non-volatile storage elements of the group, applying a voltage that is different than the second voltage to a neighbor non-volatile storage element of the group in coordination with applying the particular voltage, and verifying programming of the particular non-volatile storage element based on the particular voltage. The first set of one or more non-volatile storage elements are on a first side of the particular non-volatile storage element and have already been subjected to one or more programming processes since a last erase of the group. The first voltage is applied in coordination with the particular voltage. The second set of one or more non-volatile storage elements are on a second side of the particular non-volatile storage element and have not already been subjected to a programming processes since the last erase of the group. The second voltage is applied in coordination with the particular voltage. The neighbor non-volatile storage element is next to the particular non-volatile storage element on the second side of the particular non-volatile storage element. The neighbor non-volatile storage element has not been subjected to programming since erasing the group.

One embodiment includes applying a particular voltage to a particular non-volatile storage element of a group of connected non-volatile storage elements, applying a first voltage to a first set of one or more non-volatile storage elements of the group, the first set of one or more non-volatile storage elements have already been subjected to one or more programming processes since a last erase of the group, applying a second voltage to a second set of one or more non-volatile storage elements of the group, applying a voltage that is different than the second voltage to a neighbor non-volatile storage element of the group in coordination with applying the particular voltage, verifying programming of the particular non-volatile storage element based on the particular voltage, and reading data from the particular non-volatile storage element. The reading of data includes applying a data dependent voltage to the neighbor non-volatile storage element based on a condition of the neighbor non-volatile storage element. The first voltage is applied in coordination with the particular voltage. The second set of one or more non-volatile storage elements have not already been subjected to a programming processes since the last erase of the group, the second voltage is applied in coordination with the particular voltage. The neighbor non-volatile storage element is next to the particular non-volatile storage element.

One embodiment includes applying a particular voltage to a particular non-volatile storage element of a group of connected non-volatile storage elements, applying a first voltage to one or more non-volatile storage elements of the group that have already been subjected to one or more programming processes since a last erase of the group, applying a second voltage to a set of one or more non-volatile storage elements of the group that have not already been subjected to a programming processes since erasing the group, selecting a dependent voltage based on a number of non-volatile storage elements in the set, applying (in coordination with the particular voltage) the dependent voltage to a non-volatile storage element that is a neighbor of the particular non-volatile storage element, and sensing a condition related to the particular non-volatile storage element and the particular voltage. The first voltage is applied in coordination with the particular voltage. The second voltage is applied in coordination with the particular voltage.

One example implementation comprises a plurality of non-volatile storage elements and a managing circuit in communication with the plurality of non-volatile storage elements for performing the processes discussed herein.

BRIEF DESCRIPTION OF THE DRAWINGS

FIG. 10A depicts a NAND string.

FIG. 10B depicts a NAND string.

FIGS. 14A-G are tables depicting the order of programming non-volatile memory in various embodiments.

FIG. 16 is a flow chart describing one embodiment of a process for performing a read operation for non-volatile memory.

FIG. 17 is a flow chart describing one embodiment of a process for recovering data.

FIG. 22 is a flow chart describing one embodiment of a process for reading data from an upper page.

FIG. 24 is a flow chart describing one embodiment of a process for reading data while compensating for floating gate to floating gate (or dielectric region to dielectric region) coupling.

FIG. 26 is a flow chart describing one embodiment of a process for reading upper page data using a correction.

DETAILED DESCRIPTION

Figure 1:
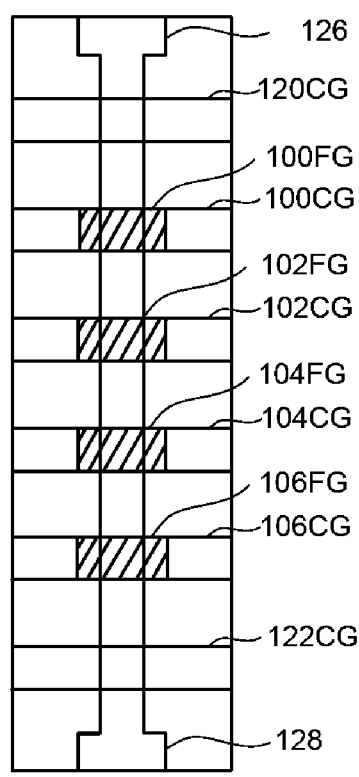
FIG. 1 is a top view of a NAND string.
Figure 2:
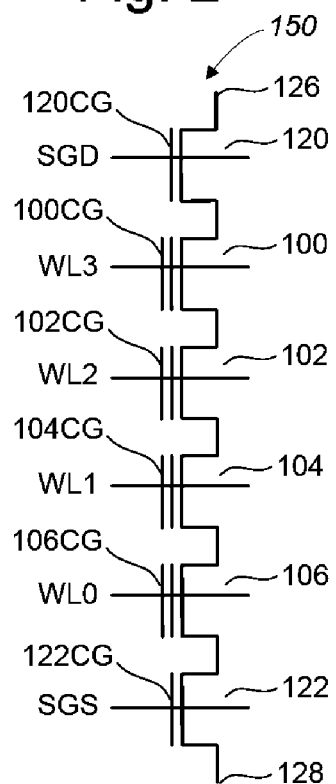
FIG. 2 is an equivalent circuit diagram of the NAND string.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted in FIGS. 1 and 2. Select gate 120 is connected to select line SGD. Select gate 122 is connected to select line SGS.

Figure 3:
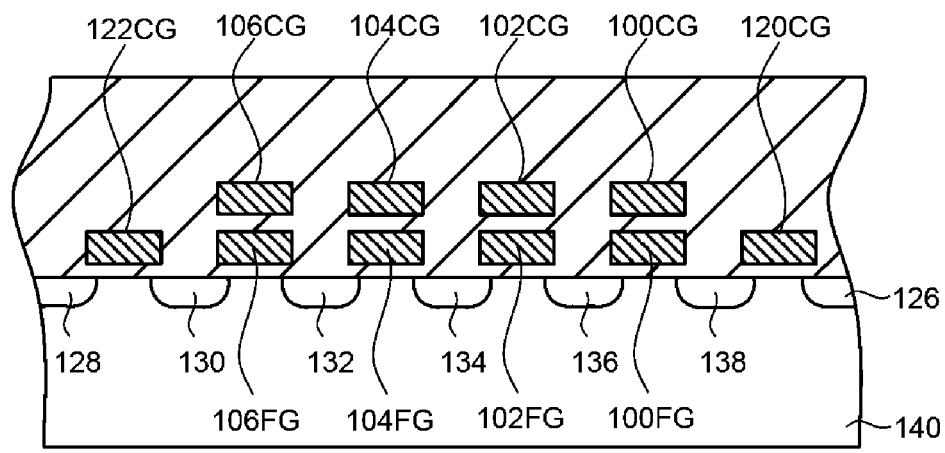
FIG. 3 is a cross-sectional view of the NAND string.

FIG. 3 provides a cross-sectional view of the NAND string described above. As depicted in FIG. 3, the transistors of the NAND string are formed in p-well region 140. Each transistor includes a stacked gate structure that consists of a control gate (100CG, 102CG, 104CG and 106CG) and a floating gate (100FG, 102FG, 104FG and 106FG). The control gates and the floating gates are typically formed by depositing poly-silicon layers. The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped diffusion regions 130, 132, 134, 136 and 138 are shared between neighboring cells, through which the cells are connected to one another in series to form a NAND string. These N+ doped regions form the source and drain of each of the cells. For example, N+ doped region 130 serves as the drain of transistor 122 and the source for transistor 106, N+ doped region 132 serves as the drain for transistor 106 and the source for transistor 104, N+ doped region 134 serves as the drain for transistor 104 and the source for transistor 102, N+ doped region 136 serves as the drain for transistor 102 and the source for transistor 100, and N+ doped region 138 serves as the drain for transistor 100 and the source for transistor 120. N+ doped region 126 connects to the bit line for the NAND string, while N+ doped region 128 connects to a common source line for multiple NAND strings.

Note that although FIGS. 1-3 show four memory cells in the NAND string, the use of four transistors is provided only as an example. A NAND string used with the technology described herein can have less than four memory cells or more than four memory cells. For example, some NAND strings will include 8 memory cells, 16 memory cells, 32 memory cells, 64 memory cells, etc. The discussion herein is not limited to any particular number of memory cells in a NAND string.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00" In one example of a NAND-type memory, the threshold voltage after an erase operation is negative and defined as "11." Positive threshold voltages are used for the states of "10," "01," and "00."

Relevant examples of NAND-type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 5,386,422; U.S. Pat. No. 6,456,528; and U.S. Pat. Publication No. US2003/0002348). Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory cells described in this paragraph can also be used with the present invention. Thus, the technology described herein also applies to coupling between dielectric regions of different memory cells.

Another approach to storing two bits in each cell has been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory cells described in this paragraph can also be used with the present invention.

Figure 4:
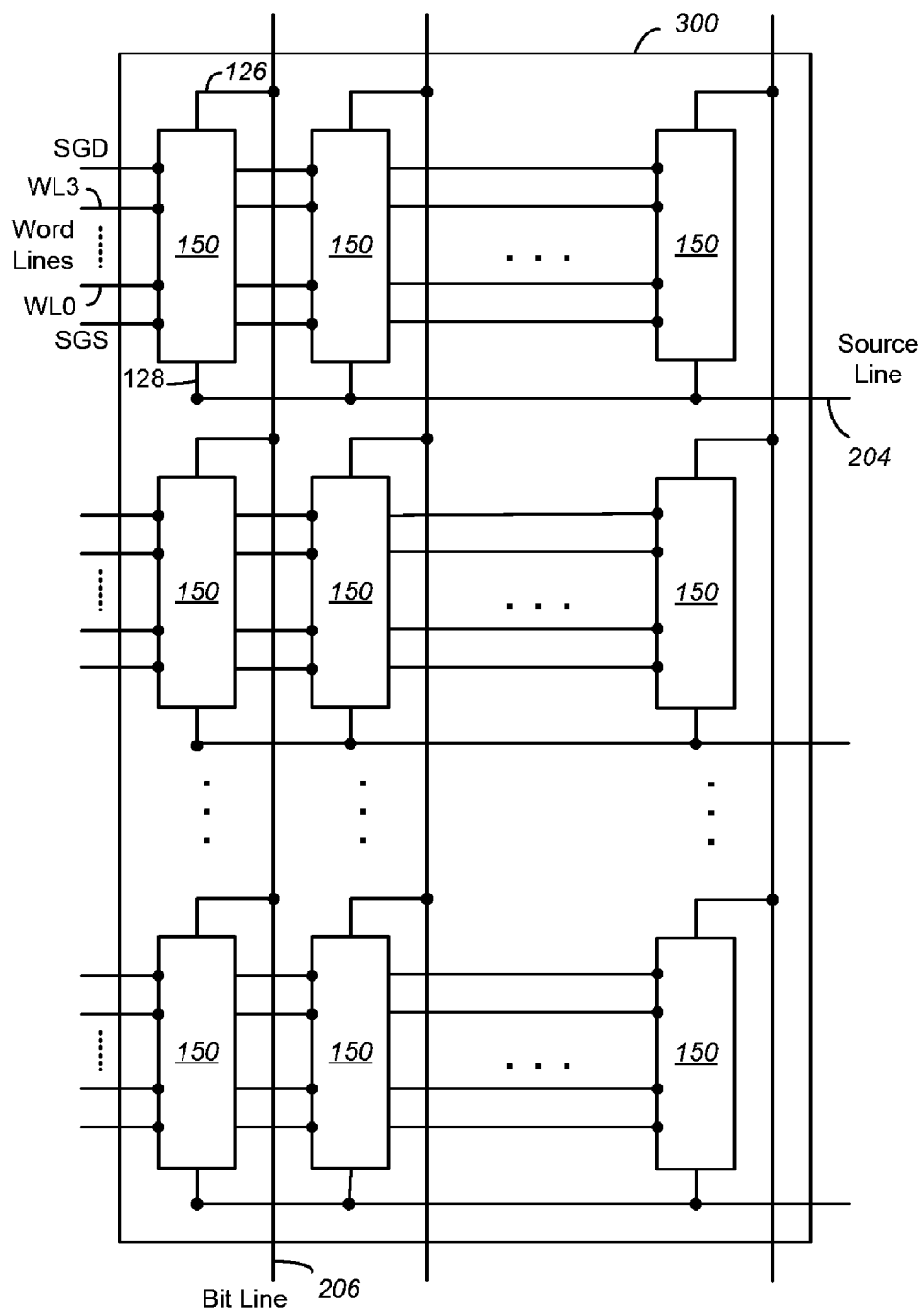
FIG. 4 is a block diagram of an array of NAND flash memory cells.

FIG. 4 illustrates an example of an array of NAND cells, such as those shown in FIGS. 1-3. Along each column, a bit line 206 is coupled to the drain terminal 126 of the drain select gate for the NAND string 150. Along each row of NAND strings, a source line 204 may connect all the source terminals 128 of the source select gates of the NAND strings. An example of a NAND architecture array and its operation as part of a memory system is found in U.S. Pat. Nos. 5,570,315; 5,774,397; and 6,046,935.

The array of memory cells is divided into a large number of blocks of memory cells. As is common for flash EEPROM systems, the block is the unit of erase. That is, each block contains the minimum number of memory cells that are erased together. Each block is typically divided into a number of pages. In one embodiment, a page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages. In some embodiments, a row of NAND strings comprises a block.

Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, separate blocks, or another unit of cells.

Figure 5:
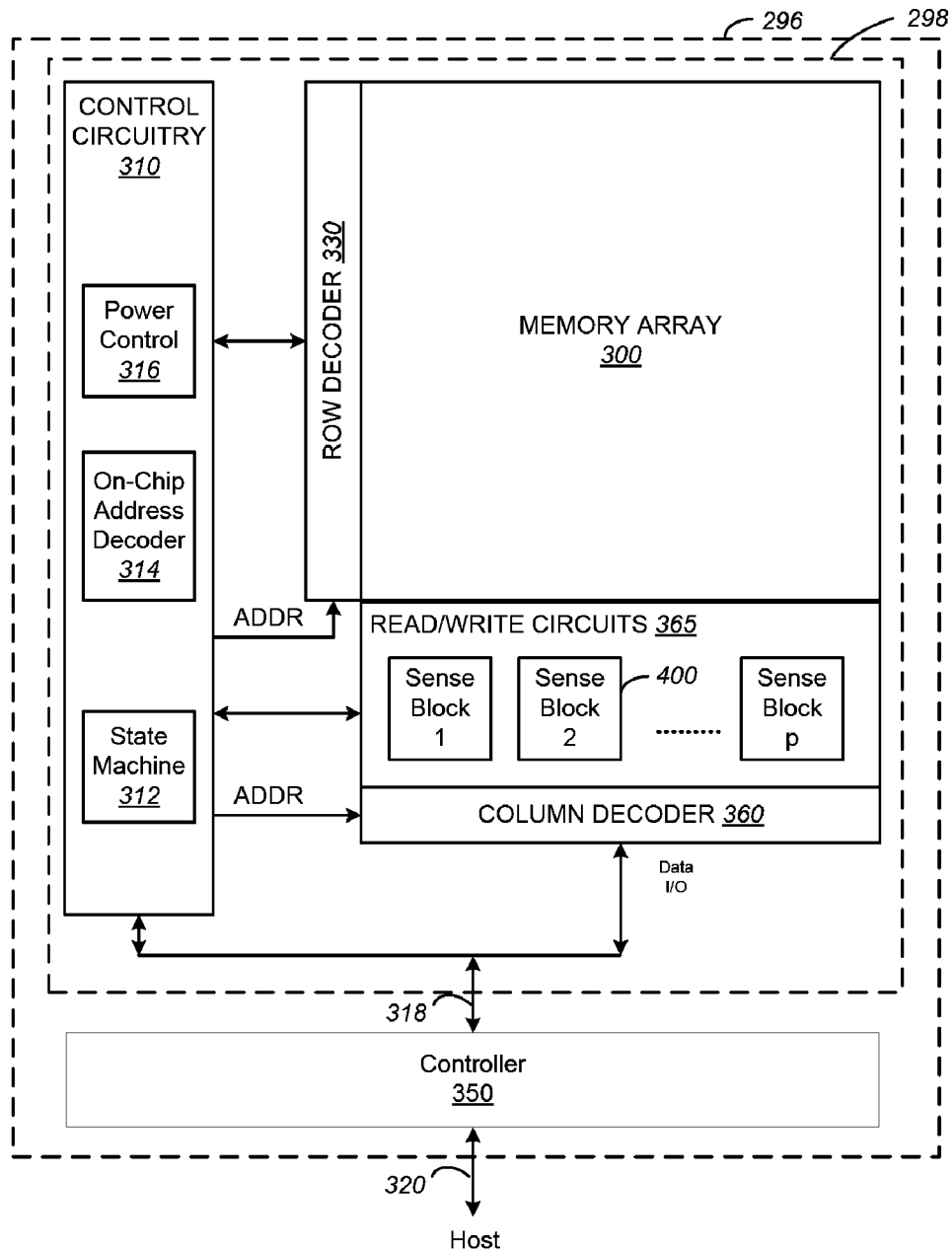
FIG. 5 is a block diagram of a non-volatile memory system.

FIG. 5 illustrates a memory device 296 having read/write circuits for reading and programming a page of memory cells in parallel, according to one embodiment of the present invention. Memory device 296 may include one or more memory die 298. Memory die 298 includes a two-dimensional array of memory cells 300, control circuitry 310, and read/write circuits 365. In some embodiments, the array of memory cells can be three dimensional. The memory array 300 is addressable by word lines via a row decoder 330 and by bit lines via a column decoder 360. The read/write circuits 365 include multiple sense blocks 400 and allow a page of memory cells to be read or programmed in parallel. Typically a controller 350 is included in the same memory device 296 (e.g., a removable storage card) as the one or more memory die 298. Commands and Data are transferred between the host and controller 350 via lines 320 and between the controller and the one or more memory die 298 via lines 318.

The control circuitry 310 cooperates with the read/write circuits 365 to perform memory operations on the memory array 300. The control circuitry 310 includes a state machine 312, an on-chip address decoder 314 and a power control module 316. The state machine 312 provides chip-level control of memory operations. The on-chip address decoder 314 provides an address interface between that used by the host or a memory controller to the hardware address used by the decoders 330 and 360. The power control module 316 controls the power and voltages supplied to the word lines and bit lines during memory operations.

In some implementations, some of the components of FIG. 5 can be combined. In various designs, one or more of the components of FIG. 5 (alone or in combination), other than memory cell array 300, can be thought of as a managing circuit. For example, one or more managing circuits may include any one of or a combination of control circuitry 310, state machine 312, decoders 314/360, power control 316, sense blocks 400, read/write circuits 365, controller 350, etc.

Figure 6:
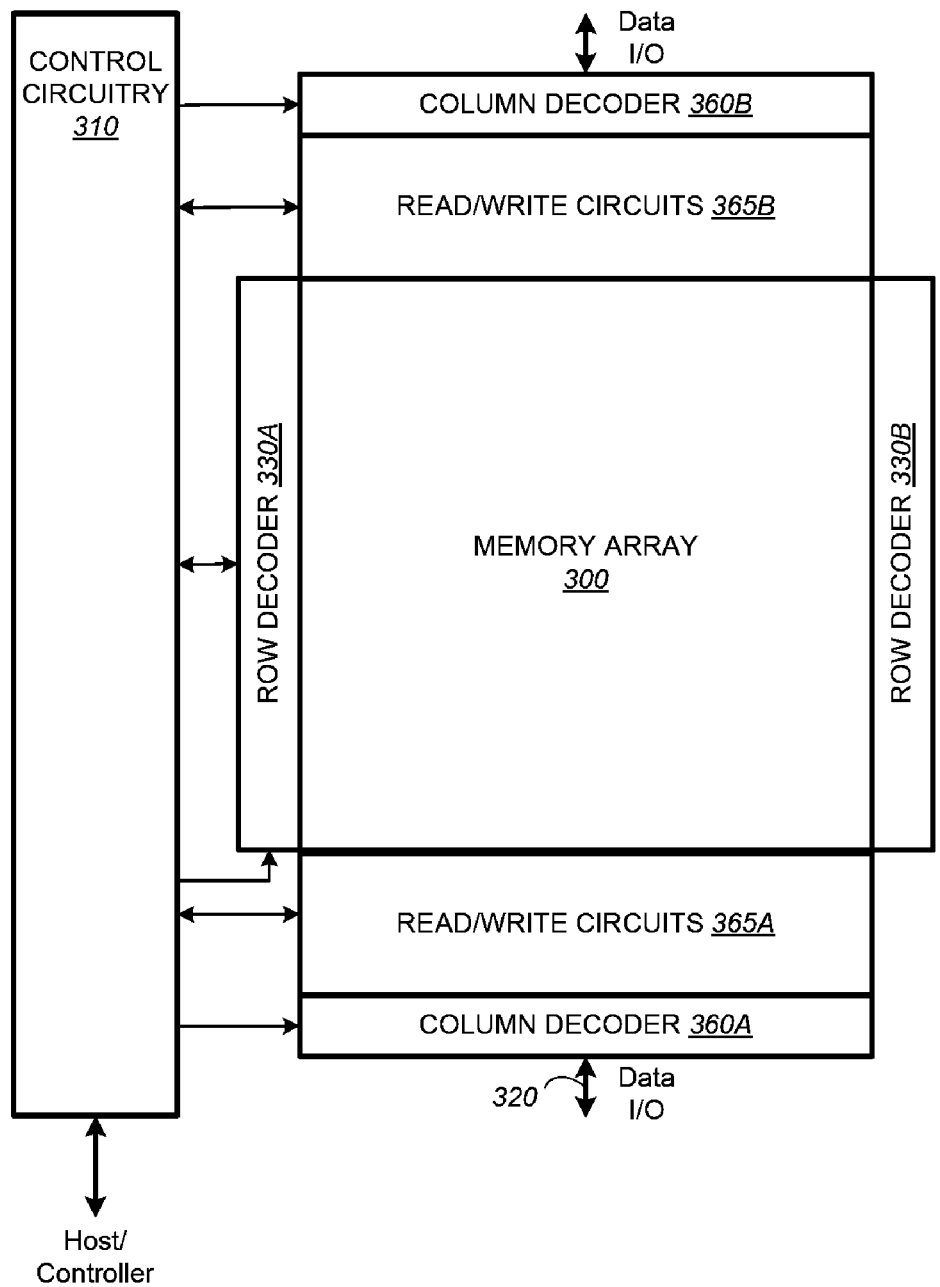
FIG. 6 is a block diagram of a non-volatile memory system.

FIG. 6 illustrates another arrangement of the memory device 296 shown in FIG. 5. Access to the memory array 300 by the various peripheral circuits is implemented in a symmetric fashion, on opposite sides of the array, so that the densities of access lines and circuitry on each side are reduced by half. Thus, the row decoder is split into row decoders 330A and 330B and the column decoder into column decoders 360A and 360B. Similarly, the read/write circuits are split into read/write circuits 365A connecting to bit lines from the bottom and read/write circuits 365B connecting to bit lines from the top of the array 300. In this way, the density of the read/write modules is essentially reduced by one half. The device of FIG. 6 can also include a controller, as described above for the device of FIG. 5.

Figure 7:
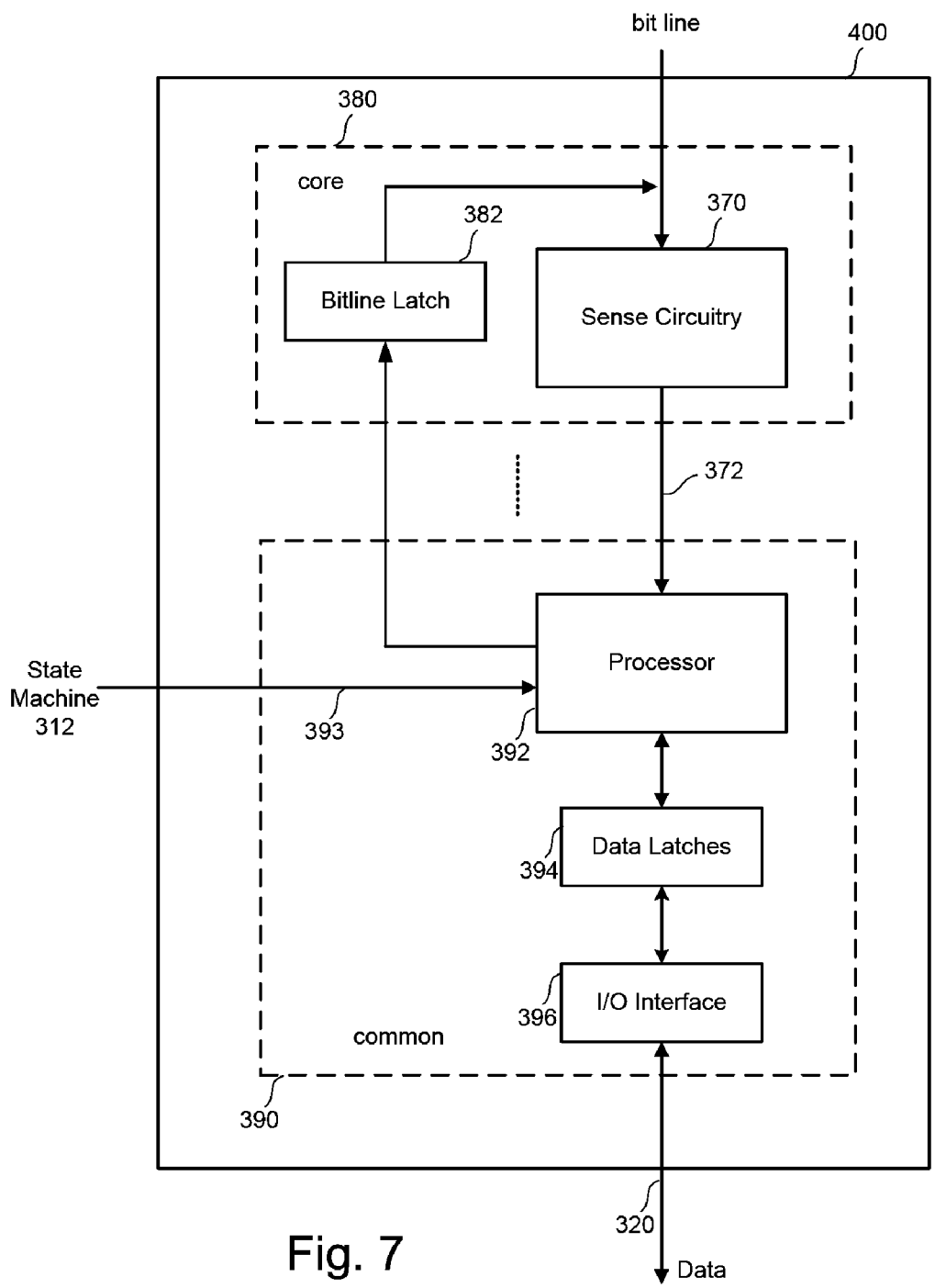
FIG. 7 is a block diagram depicting one embodiment of the sense block.

FIG. 7 is a block diagram of an individual sense block 400 partitioned into a core portion, referred to as a sense module 380, and a common portion 390. In one embodiment, there will be a separate sense module 380 for each bit line and one common portion 390 for a set of multiple sense modules 380. In one example, a sense block will include one common portion 390 and eight sense modules 380. Each of the sense modules in a group will communicate with the associated common portion via a data bus 372. For further details refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 380 comprises sense circuitry 370 that determines whether a conduction current in a connected bit line is above or below a predetermined threshold level. Sense module 380 also includes a bit line latch 382 that is used to set a voltage condition on the connected bit line. For example, a predetermined state latched in bit line latch 382 will result in the connected bit line being pulled to a state designating program inhibit (e.g., Vdd).

Common portion 390 comprises a processor 392, a set of data latches 394 and an I/O Interface 396 coupled between the set of data latches 394 and data bus 320. Processor 392 performs computations. For example, one of its functions is to determine the data stored in the sensed memory cell and store the determined data in the set of data latches. The set of data latches 394 is used to store data bits determined by processor 392 during a read operation. It is also used to store data bits imported from the data bus 320 during a program operation. The imported data bits represent write data meant to be programmed into the memory. I/O interface 396 provides an interface between data latches 394 and the data bus 320.

During read or sensing, the operation of the system is under the control of state machine 312 that controls the supply of different control gate voltages to the addressed cell. As it steps through the various predefined control gate voltages corresponding to the various memory states supported by the memory, the sense module 380 may trip at one of these voltages and an output will be provided from sense module 380 to processor 392 via bus 372. At that point, processor 392 determines the resultant memory state by consideration of the tripping event(s) of the sense module and the information about the applied control gate voltage from the state machine via input lines 393. It then computes a binary encoding for the memory state and stores the resultant data bits into data latches 394. In another embodiment of the core portion, bit line latch 382 serves double duty, both as a latch for latching the output of the sense module 380 and also as a bit line latch as described above.

It is anticipated that some implementations will include multiple processors 392. In one embodiment, each processor 392 will include an output line (not depicted in FIG. 7) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 392 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 394 from the data bus 320. The program operation, under the control of the state machine, comprises a series of programming voltage pulses applied to the control gates of the addressed memory cells. Each programming pulse is followed by a read back (verify) to determine if the cell has been programmed to the desired memory state. Processor 392 monitors the read back memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate. In other embodiments the processor initially loads the bit line latch 382 and the sense circuitry sets it to an inhibit value during the verify process.

Data latch stack 394 contains a stack of data latches corresponding to the sense module. In one embodiment, there are three data latches per sense module 380. In some implementations (but not required), the data latches are implemented as a shift register so that the parallel data stored therein is converted to serial data for data bus 320, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory", Inventors Siu Lung Chan and Raul-Adrian Cernea, filed on Dec. 28, 2005. All five of the immediately above-listed patent documents are incorporated herein by reference in their entirety.

Figure 7A:
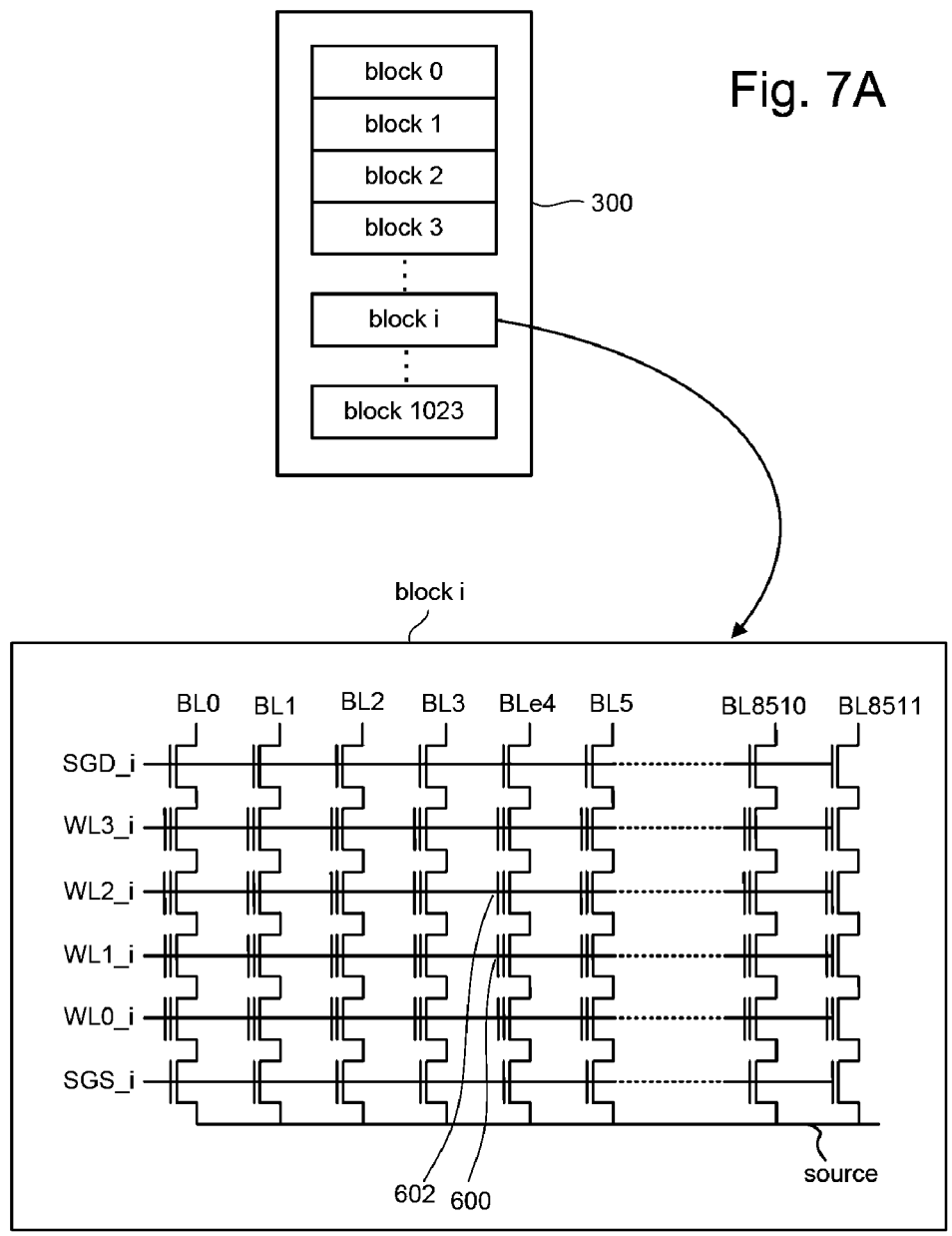
FIG. 7A is a block diagram of a memory array.

With reference to FIG. 7A, an exemplary structure of memory cell array 302 is described. As one example, a NAND flash memory is partitioned into 1,024 blocks. Other sized arrays can also be used. The data stored in each block can be simultaneously erased. In one embodiment, the block is the minimum unit of memory cells that are simultaneously erased. In this example, each block includes 8,512 columns corresponding to bit lines BL0, BL1, . . . BL8511. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 7A shows four memory cells connected in series to form a NAND string. Although four cells are shown to be included in each NAND string, more or less than four can be used (e.g., 16, 32, or another number). One terminal of the NAND string is connected to a corresponding bit line via a drain select gate (connected to select gate drain line SGD), and another terminal is connected to c-source via a source select gate (connected to select gate source line SGS).

Figure 8:
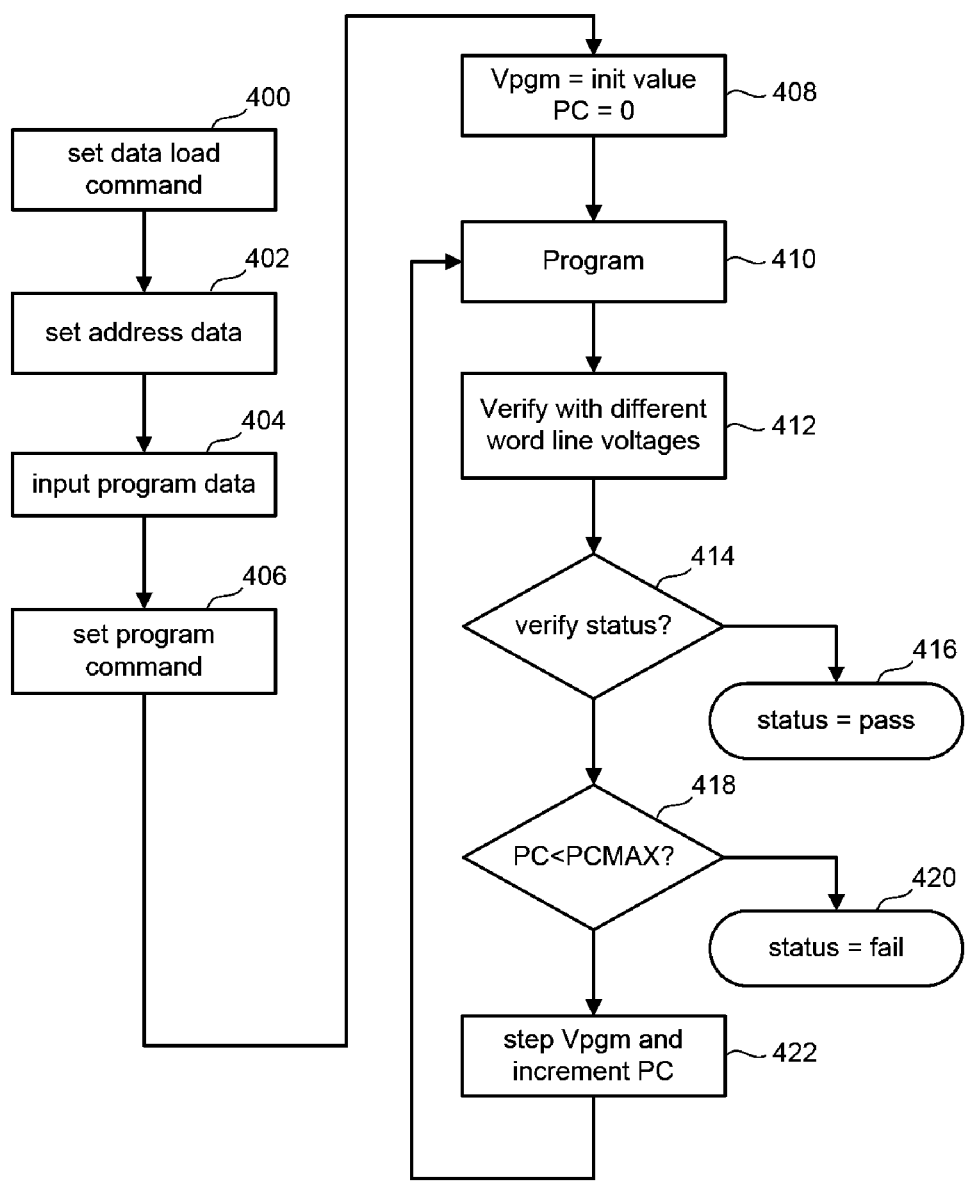
FIG. 8 is a flow chart describing one embodiment of a process for programming non-volatile memory.

FIG. 8 is a flow chart describing one embodiment of a method for programming non-volatile memory. In one implementation, memory cells are erased (in blocks or other units) prior to programming. In step 400 of FIG. 8, a "data load" command is issued by the controller and input received by control circuitry 310. In step 402, address data designating the page address is input to decoder 314 from the controller or host. In step 404, a page of program data for the addressed page is input to a data buffer for programming. That data is latched in the appropriate set of latches. In step 406, a "program" command is issued by the controller to state machine 312.

Figures 9, 11, 12:
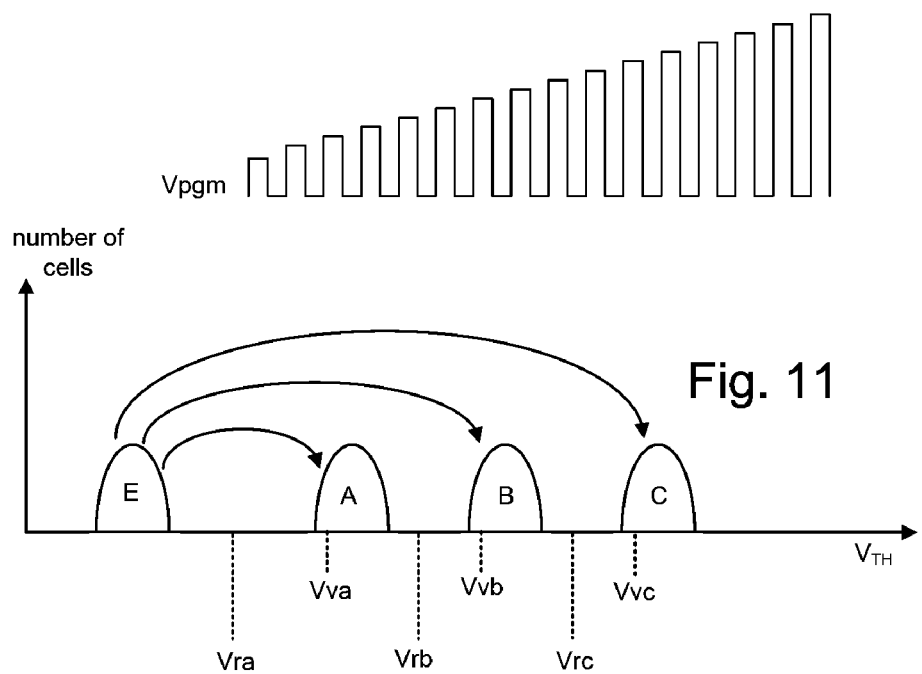
FIG. 9 is an example wave form applied to the control gates of non-volatile memory cells.
FIG. 11 depicts an example set of threshold voltage distributions.
FIG. 12 depicts an example set of threshold voltage distributions.

Triggered by the "program" command, the data latched in step 404 will be programmed into the selected memory cells controlled by state machine 312 using the stepped pulses of FIG. 9 applied to the appropriate word line. In step 408, the program voltage Vpgm is initialized to the starting pulse (e.g., 12 V or other value) and a program counter PC maintained by state machine 312 is initialized at 0. In step 410, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

In step 412, the states of the selected memory cells are verified using different voltages on the word lines, which means different voltage to the control gates of the memory cells of a NAND string. More details of the verify process are provided below. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected cells have been programmed. In step 414, it is checked whether all of the data latches are storing logic "1." If so, the programming process is complete and successful because all selected memory cells were programmed and verified. A status of "PASS" is reported in step 416. In one embodiment, the verification of step 412 includes providing a different one or more voltages to memory cells adjacent to the memory cells being programmed than that which is provided to the other unselected memory cells. For example, if memory cells on word line WLn are being programmed, then the voltage applied to memory cells on word lines WLn+1 will be different than the voltage applied to other unselected word lines. This compensation will be discussed in more detail below with respect to FIG. 10.

If, in step 414, it is determined that not all of the data latches are storing logic "1," then the programming process continues. In step 418, the program counter PC is checked against a program limit value PCMAX. One example of a program limit value is 20; however, other numbers can also be used. If the program counter PC is not less than 20, then the program process has failed and a status of "FAIL" is reported in step 420. If the program counter PC is less than 20, then the Vpgm level is increased by the step size and the program counter PC is incremented in step 422. After step 422, the process loops back to step 410 to apply the next Vpgm pulse.

FIG. 9 shows a series of program pulses that are applied to the word line selected for programming. In between program pulses are a set of verify pulses (not depicted). In some embodiments, there can be a verify pulse for each state that data is being programmed into. In other embodiments, there can be more or less verify pulses.

In one embodiment, data is programmed to memory cells along a common word line. Thus, prior to applying the program pulses of FIG. 9, one of the word lines is selected for programming. This word line will be referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 of FIG. 2 is the selected word line, then WL1 is the source side neighboring word line and WL3 is the drain side neighboring word line.

Each block of memory cells includes a set of bit lines forming columns and a set of word lines forming rows. In one embodiment, the bit lines are divided into odd bit lines and even bit lines. Memory cells along a common word line and connected to the odd bit lines are programmed at one time, while memory cells along a common word line and connected to even bit lines are programmed at another time ("odd/even programming"). In another embodiment, memory cells are programmed along a word line for all bit lines in the block ("all bit line programming"). In other embodiments, the bit lines or block can be broken up into other groupings (e.g., left and right, more than two groupings, etc.).

Figure 10:
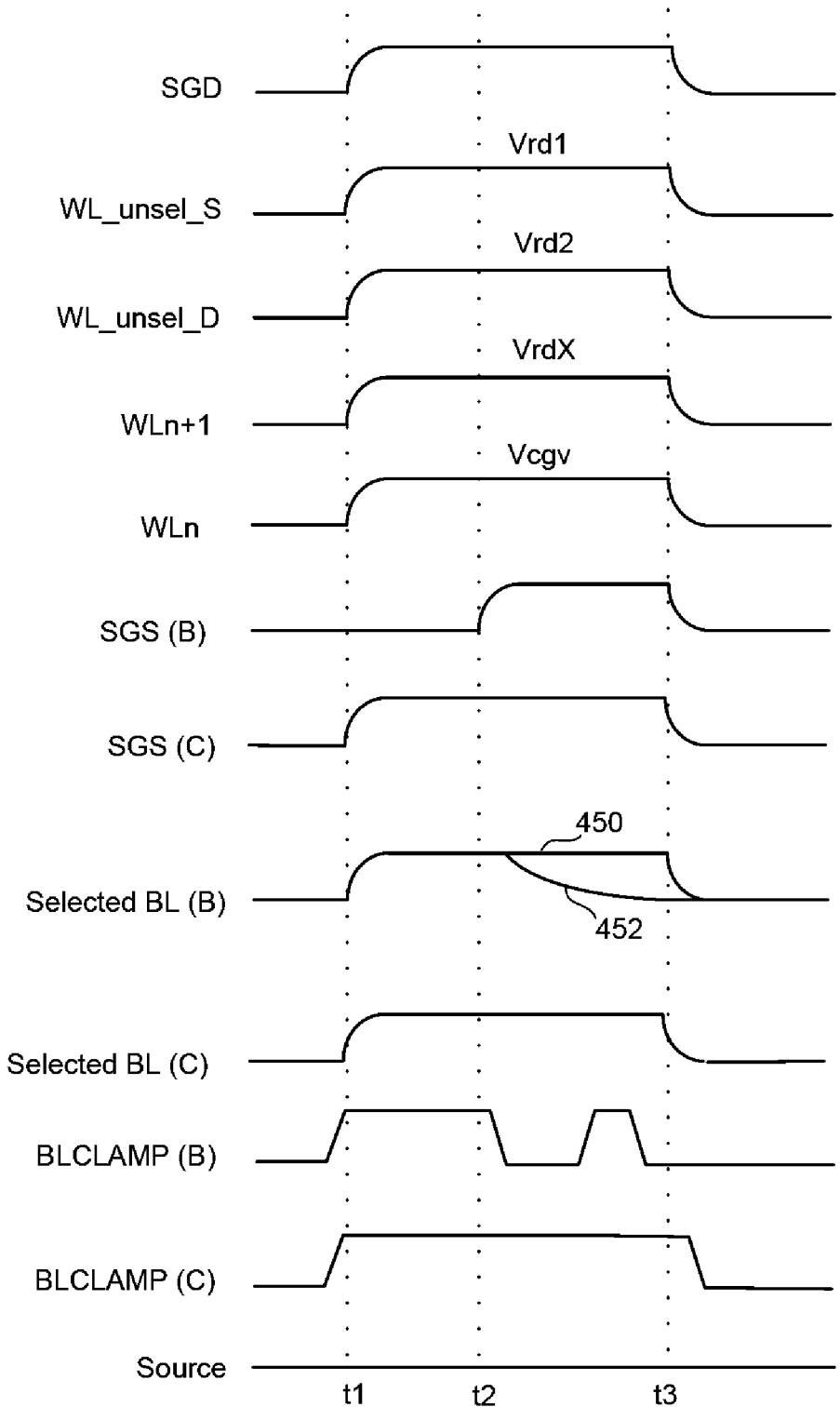
FIG. 10 is a timing diagram that explains the behavior of certain signals during read/verify operations.

FIG. 10 is a timing diagram depicting the behavior of various signals during one iteration of a verify process. For example, if the memory cells are binary memory cells, the process of FIG. 10 may be performed during an iteration of step 412. If the memory cells are multi-state memory cells with four states (e.g., E, A, B, and C), the process of FIG. 10 may be performed three times during an iteration of step 412.

In general, during the read and verify operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In one embodiment, a memory array that uses all bit line programming can measure the conduction current of a memory cell by the rate it discharges or charges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not. In one embodiment, a memory array that uses odd/even programming can measure the conduction current of a memory cell by determining whether the bit line has discharged. FIG. 10 explains both examples.

FIG. 10 shows signals SGD, WL_unsel_S. WL_unsel_D, WLn+1, WLn, SGS, Selected BL, BLCLAMP, and Source starting at Vss (approximately 0 volts). SGD represents the gate of the drain side select gate. SGS is the gate of the source side select gate. WLn is the word line selected for reading/verification. WLn+1 is the unselected word line that is the drain side neighboring word line to WLn. WL_unsel_S represents the unselected word lines on the source side of the selected word line. For example, if WL2 is the selected word line, then WL1 and WL0 are the unselected word lines on the source side of the selected word line (See FIG. 7A). WL_unsel_D represents the unselected word lines on the drain side of the selected word line, other than the drain side neighbor. For example, if WL1 is the selected word line, then WL3 is an unselected word line on the source side of the selected word line (See FIG. 7A). Selected BL is the bit line selected for reading/verification. Source is the source line for the memory cells. BLCLAMP is an analog signal that sets the value of the bit line when charged from the sense amplifier. Note that there are two versions of SGS, Selected BL and BLCLAMP depicted. One set of these signals SGS (B), Selected BL (B) and BLCLAMP (B) depict a read/verify operation for an array of memory cells that measure the conduction current of a memory cell by determining whether the bit line has discharged. Another set of these signals SGS (C), Selected BL (C) and BLCLAMP (C) depict a read/verify operation for an array of memory cells that measure the conduction current of a memory cell by the rate it discharges or charges a dedicated capacitor in the sense amplifier.

First, the behavior of the sensing circuits and the array of memory cells that are involved in measuring the conduction current of a memory cell by determining whether the bit line has discharged will be discussed with respect to SGS (B), Selected BL (B), and BLCLAMP (B). At time t1 of FIG. 10, SGD is raised to Vdd (e.g., approximately 3.5 volts), unselected word lines WL_unsel_S are raised to Vrd1 (e.g., approximately 5.5 volts), unselected word lines WL_unsel_D are raised to Vrd2, the drain side neighboring word line WLn+1 is raised to VrdX, the selected word line WLn is raised to a verify level Vcgv (e.g., Vva, Vvb, or Vvc of FIG. 11) for a verify operation, and BLCLAMP (B) is raised to a pre-charging voltage to pre-charge the selected bit line Selected BL(B) (e.g., to approximately 0.7 volts). The voltages Vrd1, Vrd2 and VrdX act as pass voltages because they cause the unselected memory cells to turn on and act as pass gates. In one embodiment, Vrd2 is approximately 2.5-4 volts lower than Vrd1; however, in other embodiments other values for Vrd2 can be used that are even lower than Vrd1 or higher than Vrd1. In some embodiments, VrdX is equal to or slightly lower than Vrd1. In some embodiments, VrdX is greater than Vrd2 and lower (e.g., 2.4-3 volts lower) than Vrd1 to accommodate the data dependent read processes described below. Applying Vrd2 lower than Vrd1 compensates for the back pattern effect described above. At time t2, BLCLAMP (B) is lowered to Vss so the NAND string can control the bit line. Also at time t2, the source side select gate is turned on by raising SGS (B) to Vdd. This provides a path to dissipate the charge on the bit line. If the threshold voltage of the memory cell selected for reading is greater than Vcgr or the verify level applied to the selected word line WLn, then the selected memory cell will not turn on and the bit line will not discharge, as depicted by signal line 450. If the threshold voltage in the memory cell selected for reading is below Vcgr or below the verify level applied to the selected word line WLn, then the memory cell selected for reading will turn on (conduct) and the bit line voltage will dissipate, as depicted by curve 452. At some point after time t2 and prior to time t3 (as determined by the particular implementation), the sense amplifier will determine whether the bit line has dissipated a sufficient amount. In between t2 and t3, BLCLAMP (B) is raised to let the sense amplifier measure the evaluated BL voltage and then lowered, as depicted in FIG. 10. At time t3, the depicted signals will be lowered to Vss (or another value for standby or recovery). Note that in other embodiments, the timing of some of the signals can be changed (e.g. shift the signal applied to the neighbor).

Next, the behavior of the sensing circuits and the array of memory cells that measure the conduction current of a memory cell by the rate it discharges or charges a dedicated capacitor in the sense amplifier will be discussed with respect to SGS (C), Selected BL (C) and BLCLAMP (C). At time t1 of FIG. 10, SGD is raised to Vdd (e.g., approximately 3.5 volts), the unselected word lines WL_unsel_S are raised to Vrd1, unselected word lines WL_unsel_D are raised to Vrd2, the drain side neighboring word line WLn+1 is raised to VrdX, the selected word line WLn is raised to Vcgv (e.g., Vva, Vvb, or Vvc of FIG. 11) for a verify operation, and BLCLAMP (C) is raised. In this case, the sense amplifier holds the bit line voltage constant regardless of what the NAND sting is doing, so the sense amplifier measures the current flowing with the bit line "clamped" to that voltage. Therefore, BLCLAMP (C) rises at t1 and does not change from t1 to t3. At some point after time t1 and prior to time t3 (as determined by the particular implementation), the sense amplifier will determine whether the capacitor in the sense amplifier has dissipated or charged a sufficient amount. At time t3, the depicted signals will be lowered to Vss (or another value for standby or recovery). Note that in other embodiments, the timing of some of the signals can be changed.

A read operation is performed in the same manner as discussed above with respect to FIG. 10, except that Vcgr (e.g., Vra, Vrb, or Vrc of FIG. 11) is applied to WLn, the unselected word lines (other than the drain side neighbor) will receive Vread (where Vread=Vrd1) and the drain side neighbor word line will receive a data dependent voltage discussed below.

FIG. 10A depicts a NAND string and a set of voltages applied to the NAND string during the verify operation depicted in FIG. 10. The NAND string of FIG. 10A includes eight memory cells 464, 466, 468, 470, 472, 474, 476 and 478. Each of those eight memory cells includes a floating gate (FG) and a control gate (CG). Between each of the floating gates are source/drain regions 490. In some implementations, there is a P-type substrate (e.g., Silicon), an N-well within the substrate and a P-well within the N-well (all of which are not depicted to make the drawings more readable). Note that the P-well may contain a channel implantation that is usually a P-type implantation that determines or helps to determine the threshold voltage and other characteristics of the memory cells. The source/drain regions 490 are N+ diffusion regions that are formed in the P-well. At one end of the NAND string is a drain side select gate 384. The drain select gate 324 connects the NAND string to the corresponding bit line via bit line contact 494. At another end of the NAND string is a source select gate 482. Source select gate 482 connects the NAND string to common source line 492.

During a verify operation, the selected memory cell 470 receives the verify compare voltage Vcgv. The unselected memory cells 464, 466 and 468 on the source side of selected memory cell 470 receive Vrd1 at their control gates. Memory cells 464, 466 and 468 have already been subjected to one or more programming processes that potentially caused programming of one or more pages of data stored in those memory cells since the last time that the NAND string of FIG. 10A was erased. The unselected memory cells 474, 476 and 478 on the drain side of selected memory cell 470 receive Vrd2 at their control gates. In one embodiment, unselected memory cells 474, 476 and 478 have not yet been subjected to one or more programming processes that potentially caused programming of one or more pages of data stored in those memory cells since the last time that the NAND string of FIG. 10A was erased and, therefore, they are still in the erased state. Note that receiving Vrd1 or Vrd2 is not the act of being subjected to a programming process. Drain side neighbor memory cell 472 receives VrdX. Memory cells 472, 474, 476 and 478 have not been subjected to a programming processes that potentially caused programming of one or more pages of data stored in those memory cells since the last time that the NAND string of FIG. 10A was erased. That is, at the time of performing a verification operation on memory cell 470, the unselected memory cells 464, 466 and 468 on the source side of selected memory cell 470 may be in states E, A, B, or C (see FIGS. 11-13). On the other hand, memory cells 472, 474, 476 and 478 on the drain side of selected memory cell 470 will be in the erased state E (see FIGS. 11-13).

Memory cells 464, 466 and 468 are referred to be as being on the source side of selected memory cell 470 because they are on the same NAND string as selected memory cell 470 and on the same side of selected memory cell 470 as source side select gate 482. Although FIG. 10A shows three memory cells on the source side, one or more memory cells can be on the source side. Memory cells 472, 474, 476 and 478 are referred to be as being on the drain side of selected memory cell 470 because they are on the same NAND string as selected memory cell 470 and on the same side of selected memory cell 470 as drain side select gate 484. Although FIG. 10A shows four memory cells on the drain side, one or more memory cells can be on the drain side; or two or more memory cells can be on the drain side.

FIG. 10B depicts the NAND string and a set of voltages applied to the NAND string during a read operation. During a read operation, the selected memory cell 470 receives the read compare voltage Vcgr. Unselected memory cells 464, 466, 468, 474, 476 and receive Vread at their control gates. In one embodiment Vread=Vrd1. Drain side neighbor memory cell 472 receives VreadX on its control gate.

Figure 10C:
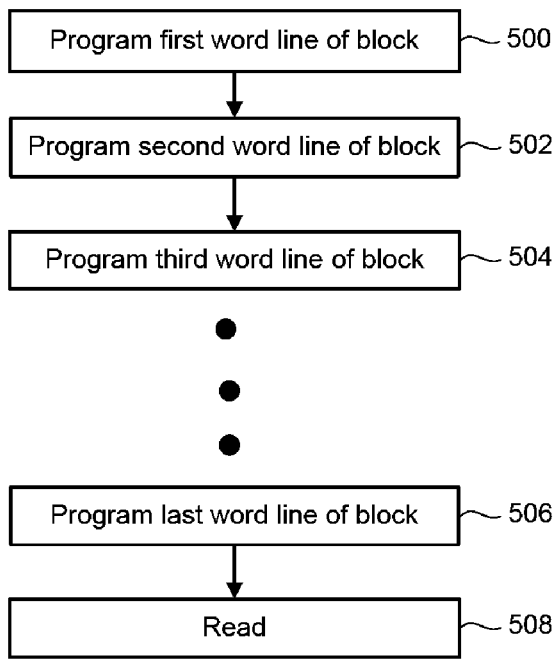
FIG. 10C is a flow chart describing one embodiment of a process for operating non-volatile storage.

FIG. 10C is a flow chart describing one embodiment of a process for programming and reading. In many applications, all of the word lines for a block are programmed. Subsequent to that programming, all or a subset of the data may be read one or more times. In some embodiments, the word lines are programmed from the source side to the drain side. For example, in step 500, memory cells connected to a first word line (e.g., WL0—See FIG. 7A) are programmed. In step 502, memory cells connected to a second word line (e.g., WL1) are programmed. In step 504, memory cells connected to a third word line are programmed. And so on, until memory cells connected to the last word line (e.g., the word line next to the drain side select gate) are programmed in step 506. In other embodiments, other orders of programming can also be used, including orders of programming that do not proceed from the source side select gate toward the drain side select gate. After all of the word lines are programmed, any one or more memory cells of the block associated with any of the word lines can be read. Consider the example of a digital camera that stores a set of pictures. It is likely that the pictures will be stored across multiple blocks, thereby, programming all of the word lines prior to any read operations. Note that other order of operation different that as depicted in FIG. 10C can be implemented.

Each word line may be subjected to one or more programming process. For example, a word line may be associated with multiple pages of data. Each programming process may be for a separate page of data. That is, the process of FIG. 8 may be performed separately for each page of data. For example, each of steps 500-506 may include multiple programming processes. In other embodiments, all pages of data associated with a word line may be programmed together or a word line may only be associated with one page of data.

Figure 10D:
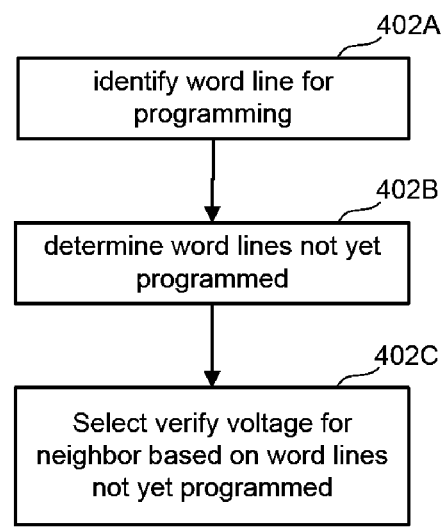
FIG. 10D is flow chart describing one embodiment of a process of choosing a voltage for a word line next to the selected word line.

In one embodiment, the voltage VrdX is dependent on the number of unselected word lines that have not yet been subjected to a program process. In one embodiment that programs from the source side to the drain side, VrdX is determined by the number of unselected word libes on the drain side of the selected word line. When considering a NAND string or other suitable grouping, the number of unselected memory cells on the drain side of the selected memory cell will be used to determine the value of VrdX. For example, if there is one unselected word line on the drain side of the selected word line, then VrdX=Vrd1-1(X), where X is equal to a small voltage in the range of 0.1 to 0.4 volts that is chosen based on simulation and device characterization. If there are two unselected word lines on the drain side of the selected word line, then VrdX=Vrd1-2(X). If there are three unselected word lines on the drain side of the selected word line, then VrdX=Vrd1-3(X); and, so on. Other formulas or mechanisms can also be used. FIG. 10D depicts a flow chart describing one embodiment of a method for selecting the appropriate level for VrdX according to one embodiment where the voltage VrdX is dependent on the number of unselected word lines on the drain side of the selected word line. In one example implementation, the steps of FIG. 10D are performed after step 402 and before step 404 of FIG. 8. In step 402A, the block and word line associated with the page address is identified. In step 402B, the word lines in the block identified in step 402A that have not yet been subjected to programming are determined. In step 402C, the voltage VrdX for the drain side neighbor of the selected word line is selected based on the number of unselected word lines on the drain side of the selected word line.

At the end of a successful program process, the threshold voltages of the memory cells should be within one or more distributions of threshold voltages for programmed memory cells or within a distribution of threshold voltages for erased memory cells, as appropriate. FIG. 11 illustrates example threshold voltage distributions for the memory cell array when each memory cell stores two bits of data. FIG. 11 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 11 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. patent application Ser. No. 10/461,244, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present invention can also be used with other multi-state structures including those that include more or less than four states.

FIG. 11 also shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 11 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. The process depicted in FIG. 18, using the control gate voltage sequence depicted in FIG. 9, will then be used to program memory cells directly into states A, B or C. While some memory cells are being programmed from state E to state A, other memory cells are being programmed from state E to state B and/or from state E to state C. When programming from state E to state C on WLn, the amount of parasitic coupling to the adjacent floating gate under WLn−1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn−1 will vary depending on the state of the adjacent cell on WLn.

FIG. 12 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530. That concludes the first programming pass.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 534. If the cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page. In both FIG. 11 and FIG. 12 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Ser. No. 11/013,125, filed on Dec. 14, 2004, inventors Sergy Anatolievich Gorobets and Yan Li, incorporated herein by reference in its entirety.

Figure 13A:
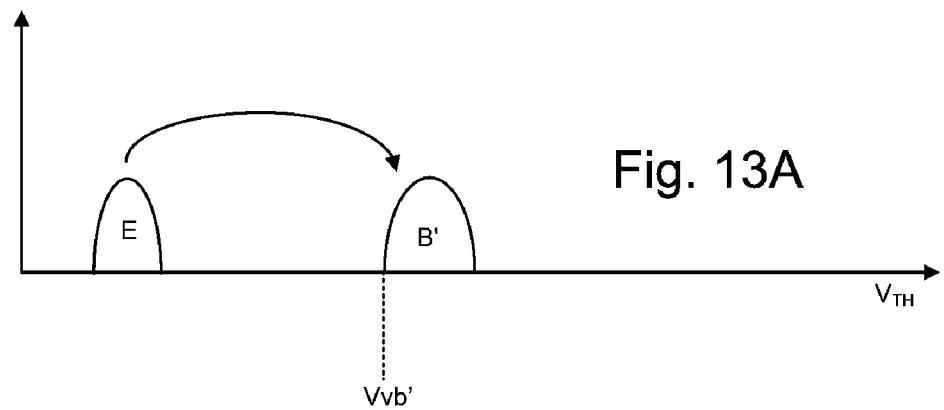
FIGS. 13A-C show various threshold voltage distributions and describe a process for programming non-volatile memory.
Figure 13B:
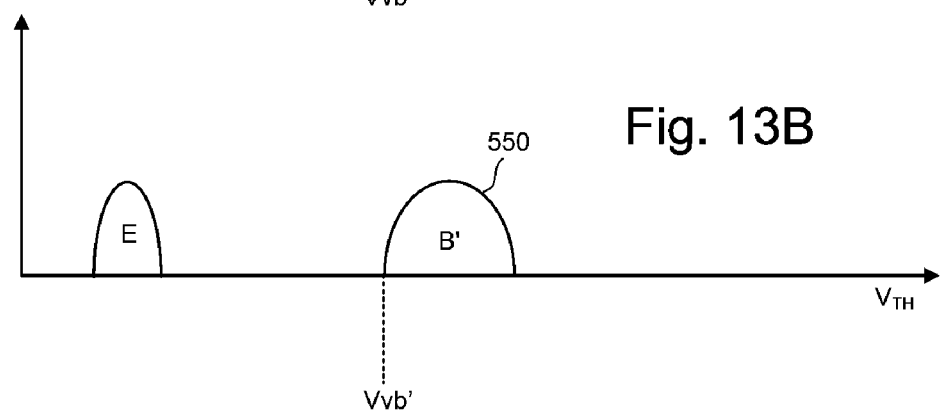
Figure 13C:
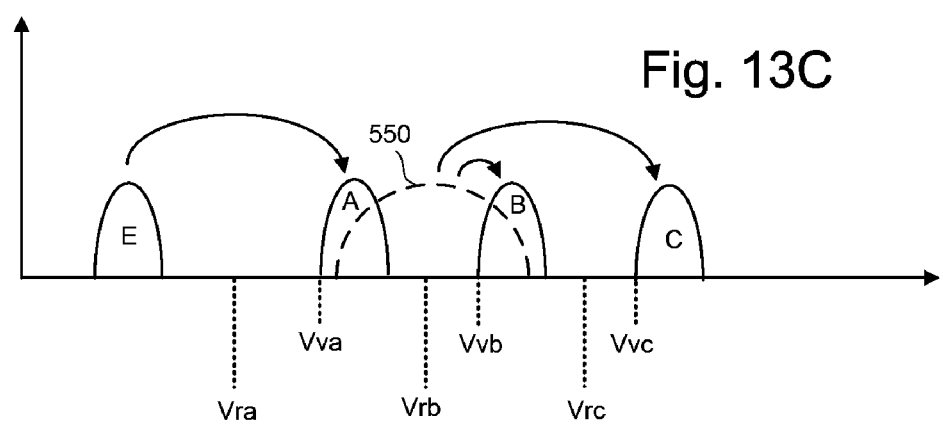

FIGS. 13A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 13A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIGS. 13A-C, the upper page stores bit 0 and the lower page stores bit 1. With reference to state B, the upper page stores bit 1 and the lower page stores bit 0. With reference to state C, both pages store bit data 0.

The programming process of FIGS. 13A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 13A therefore shows the programming of memory cells from state E to state B'. State B' depicted in FIG. 13A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, looking back at FIG. 2, after the lower page for memory cell 106 is programmed, the lower page for memory cell 104 would be programmed. After programming memory cell 104, the floating gate to floating gate coupling effect will raise the apparent threshold voltage of memory cell 106 if memory cell 104 had a threshold voltage raised from state E to state B'. This will have the effect of widening the threshold voltage distribution for state B' to that depicted as threshold voltage distribution 550 of FIG. 13B. This apparent widening of the threshold voltage distribution will be remedied when programming the upper page.

FIG. 13C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 13A-C reduces the effect of floating gate to floating gate coupling because only the upper page programming of neighbor memory cells will have an effect on the apparent threshold voltage of a given memory cell. An example of an alternate state coding is to move from distribution 550 to state C when the upper page data is a 1, and to move to state B when the upper page data is a 0.

Although FIGS. 13A-C provide an example with respect to four data states and two pages of data, the concepts taught by FIGS. 13A-C can be applied to other implementations with more or less than four states and different than two pages.

FIGS. 14A-F depict various tables that describe the order of programming according to various embodiments for the methods described by FIGS. 11, 12 and 13A-C.

FIG. 14A is a table which describes the order for programming memory cells along a bit line for all bit line programming. In this embodiment, the block with four word lines includes four pages (page 0-3). Page 0 is written first, followed by page 1, followed by page 2 and then followed by page 3. The data in page 0 includes the data stored by all the memory cells connected to word line WL0. The data in page 1 includes the data stored by the memory cells connected to word line WL1. The data in page 2 includes the data stored by memory cells connected to WL2. The data in page 3 includes the data stored by memory cells connected to word line WL3. The embodiment of FIG. 14A assumes full sequence programming, as described above with respect to FIG. 11.

FIG. 14B depicts the order of programming during odd/even programming when using the full sequence programming method described above with respect to FIG. 11. In this embodiment, a block with four word lines includes eight pages of data. The memory cells on even bit lines connected to word line WL0 store data for page 0. Memory cells on odd bit lines connected to word line WL0 store data for page 1. Memory cells on even bit lines connected to word line WL1 store data for page 2. Memory cells on odd bit lines connected to word line WL1 store data for page 3. Memory cells on even bit lines connected to word line WL2 store data for page 4. Memory cells on odd bit lines connected to word line WL2 store data for page 5. Memory cells on even bit lines connected to word line WL3 store data for page 6.

Memory cells on odd bit lines connected to word line WL3 store data for page 7. Data is programmed in numerical order according to page number, from page 0 to page 7.

The table of FIG. 14C describes the order for programming according to the two phase programming process of FIG. 12 for a memory array that performs all bit line programming. A block with four word lines is depicted to include eight pages. For memory cells connected to word line WL0, the lower page of data forms page 0 and the upper page data forms page 1. For memory cells connected to word line WL1, the lower page of data forms page 2 and the upper page data forms page 3. For memory cells connected to word line WL2, the lower page of data forms page 4 and the upper page data forms page 5. For memory cells connected to word line WL3, the lower page of data forms page 6 and the upper page data forms page 7. Data is programmed in numerical order according to page number, from page 0 to page 7.

FIG. 14D provides a table describing the order of programming the two-phase programming process of FIG. 12 for a memory architecture that performs odd/even programming. A block with four word lines includes 16 pages, where the pages are programmed in numerical order according to page number, from page 0 to page 15. For memory cells on even bit lines connected to word line WL0, the lower page of data forms page 0 and the upper page data forms page 2. For memory cells on odd bit lines connected to word line WL0, the lower page of data forms page 1 and the upper page of data forms page 3. For memory cells on even bit lines connected to word line WL1, the lower page forms page 4 and the upper page forms page 6. For memory cells on odd bit lines connected to word line WL1, the lower page forms page 5 and the upper page forms page 7. For memory cells on even bit lines connected to word line WL2, the lower page forms page 8 and the upper page forms page 10. For memory cells on odd bit lines connected to word line WL2, the lower page forms page 9 and the upper page forms page 11. For memory cells on even bit lines connected to word line WL3, the lower page forms page 12 and the upper page forms page 14. For memory cells on odd bit lines connected to word line WL3, the lower page forms page 13 and the upper page forms page 15. Alternately, as in FIG. 14E, both lower and upper pages under each word line of the even bit lines are programmed before programming both pages of the odd bit lines for this same word line.

FIGS. 14F and 14G describe the order for programming memory cells utilizing the programming method of FIGS. 13A-C. FIG. 14F pertains to the architecture that performs all bit line programming. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed in numerical order according to page number, from page 0 to page 7.

The table of FIG. 14G pertains to the architecture that performs odd/even programming. For memory cells on even bit lines connected to word line WL0, the lower page forms page 0 and the upper page forms page 4. For memory cells on odd bit lines connected to word line WL0, the lower page forms page 1 and the upper page forms page 5. For memory cells on even bit lines connected to word line WL1, the lower page forms page 2 and the upper page forms page 8. For the memory cells on odd bit lines connected to word line WL1, the lower page forms page 3 and the upper page forms page 9. For the memory cells on even bit lines connected to word line WL2, the lower page forms page 6 and the upper page forms page 12. For the memory cells on odd bit lines connected to word line WL2, the lower page forms page 7 and the upper page forms page 13. For the memory cells on even bit lines connected to word line WL3, the lower page forms page 10 and the upper page forms page 14. For the memory cells on odd bit lines connected to word line WL3, the lower page forms page 11 and the upper page forms page 15. Memory cells are programmed in numerical order according to page number, from page 0 to page 15. Finally, each of the architectures having both even and odd bit lines can be implemented with all the even bit lines located physically together in, for example, the left side of the chip, and all of the odd bit lines located together in, for example, the right side of the chip.

Note that in the embodiments of FIGS. 14A-G, memory cells are programmed along a NAND string from source side to the drain side. Also, the tables depict only an embodiment with four word lines. The various methods depicted within the tables can be applied to systems with more or less than four word lines. Examples of an architecture using odd/even programming can be found in U.S. Pat. Nos. 6,522,580 and 6,643,188; both of which are incorporated herein by reference in their entirety. More information about an architecture that uses all bit line programming can be found in the following U.S. patent documents incorporated by reference in their entirety: United States Patent Application Publication US 2004/0057283; United States Patent Application Publication US 2004/0060031; United States Patent Application Publication US 2004/0057285; United States Patent Application Publication US 2004/0057287; United States Patent Application Publication US 2004/0057318; U.S. Pat. No. 6,771,536; U.S. Pat. No. 6,781,877.

Generally, architectures that program all bit lines together will read data from all bit lines together. Similarly, architectures that program odd and even bit lines separately will generally read odd and even bit lines separately. However, such limitations are not required. The technology described herein for reading data can be used with all bit line programming or odd/even bit line programming. The technology described herein for reading data can also be used for any of the programming schemes of FIGS. 17-19, as well as other programming schemes.

Figure 15:
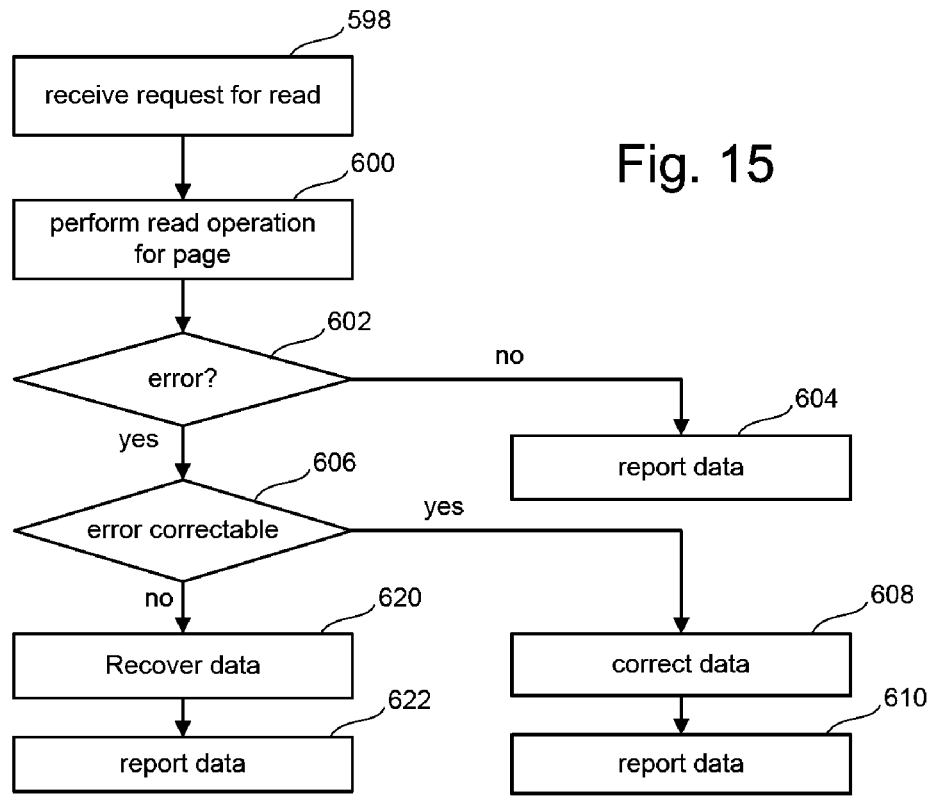
FIG. 15 is a flow chart describing one embodiment of a process for reading non-volatile memory.

FIG. 15 is a flow chart describing one embodiment for reading data from non-volatile memory cells. FIG. 15 provides the read process at the system level. In step 598, a request to read data is received. In step 600, a read operation is performed for a particular page in response to the request to read data (step 598). In one embodiment, when data for a page is programmed, the system will also create extra bits used for Error Correction Codes (ECCs) and write those ECC bits along with the page of data. ECC technologies are well known in the art. The ECC process used can include any suitable ECC process known in the art. When reading data from a page, the ECC bits will be used to determine whether there are any errors in the data (step 602). The ECC process can be performed by the controller, the state machine or elsewhere in the system. If there are no errors in the data, the data is reported to the user at step 604. For example, data will be communicated to a controller or host via data I/O lines 320. If an error is found at step 602, it is determined whether the error is correctable (step 606). The error may be due to the floating gate to floating gate coupling effect or other reasons. Various ECC methods have the ability to correct a predetermined number of errors in a set of data. If the ECC process can correct the data, then the ECC process is used to correct that data in step 608 and the data, as corrected, is reported to the user in step 610. If the data is not correctable by the ECC process, a data recovery process is performed in step 620. In some embodiments, an ECC process will be performed after step 620. More details about the data recovery process are described below. After the data is recovered, that data is reported at step 622. Note that the process of FIG. 15 can be used with data programmed using all bit line programming or odd/even bit line programming.

FIG. 16 is a flow chart describing one embodiment of a process for performing a read operation for a page (see step 600 of FIG. 15). The process of FIG. 16 can be performed for a page that encompasses all bit lines of a block, only odd bit lines of a block, only even bit lines of a block, or other subsets of bit lines of a block. In step 640, read reference voltage Vra is applied to the appropriate word line associated with the page. In step 642, the bit lines associated with the page are sensed to determine whether the addressed memory cells turn on or do not turn on based on the application of Vra to their control gates. Bit lines that conduct indicate that the memory cells were turned on; therefore, the threshold voltages of those memory cells are below Vra (e.g., in state E). In step 644 the result of the sensing for the bit lines is stored in the appropriate latches for those bit lines. In step 646, read reference voltage Vrb is applied to the word lines associated with the page being read. In step 648, the bit lines are sensed as described above. In step 650, the results are stored in the appropriate latches for the bit lines. In step 652, read reference voltage Vrc is applied to the word lines associated with the page. In step 654, the bit lines are sensed to determine which memory cells turn on, as described above. In step 656, the results from the sensing step are stored in the appropriate latches for the bit lines. In step 658, the data values for each bit line are determined. For example, if a memory cell conducts at Vra, then the memory cell is in state E. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In one embodiment, the data values are determined by processor 392. In step 660, processor 392 will store the determined data values in the appropriate latches for each bit line. In other embodiments, sensing the various levels (Vra, Vrb, and Vrc) may occur in different orders.

Steps 640-644 include performing the operation depicted in FIG. 10, with Vcgr=Vra and VreadX=Vread. Steps 646-650 include performing the operation depicted in FIG. 10, with Vcgr=Vrb and VreadX=Vread. Steps 652-656 include performing the operation depicted in FIG. 10, with Vcgr=Vrc and VreadX=Vread. Thus, one embodiment of the process of FIG. 16 does not include performing any compensation for floating gate to floating gate coupling. In another embodiment, steps 640, 646, and 652 are performed with VreadX equal to Vread4 (described below) or another value.

FIG. 17 includes a flow chart describing one embodiment of a process for recovering data (step 620). Data may include an error due to the floating gate to floating gate coupling effect (or another cause). The process of FIG. 17 attempts to read the data while compensating for the floating gate to floating gate coupling effect (or another cause of error). The compensation includes looking at the neighboring word line and determining how the programming of the neighboring word line has created a floating gate to floating gate coupling effect. For example, when reading data on word line WLn (e.g., WL2 of FIG. 7A), the process will also read the data of word line WLn+1 (e.g., WL3 of FIG. 7A). If the data on word line WLn+1 has caused an apparent change in the data on WLn, then the read process will compensate for that unintentional change.

The process depicted in FIG. 17 applies to the full sequence programming described above with respect to FIG. 11 in which two bits of one logical page are stored in each cell and will be read and reported out together. If the memory cell on the neighboring word line is in state E, there will be no floating gate to floating gate coupling effect. If the memory cell on the neighboring word line is in state A, there will be a small coupling effect. If the memory cell on the neighboring word line is in state B, there will be a medium floating gate to floating gate coupling effect. If the memory cell on the neighboring word line is in state C, there will be a larger floating gate to floating gate coupling effect. The exact coupling effect due to the neighboring word line varies by array implementation and can be determined by characterizing the device.

Step 670 in FIG. 17 includes performing a read operation for the neighboring word line WLn+1. This includes performing the process of FIG. 16 for the neighboring word line. For example, if a page in word line WL1 is being read, then step 670 includes performing the process of FIG. 16 on word line WL2. The results of step 670 are stored in the appropriate latches in step 672. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1.

When the objective is to read data on WLn, it may not necessary to have an ECC correct read of WLn+1, as bits that are read erroneously are most probably bits at tails of distributions, and to have mistaken them as belonging to another data state does not cause a big error in determining the required amount of compensation for reading the corresponding cell(s) on WLn. For example, a slightly over programmed cell on WLn+1 which was meant to be programmed to State B, having subsequently experienced the capacitive coupling effect during programming of WLn+2, may now be misread as being in state C when WLn+1 is read without coupling compensation (step 670 of FIG. 17) as part of the reading process of WLn. This misreading is not an issue for the following reasons: (1) the objective is not to read data on WLn+1, (2) the correction applied for read of corresponding cell on WLn based on apparent state of cell on WLn+1 being C-state is actually a better correction than one that would have been based on the correct read of cell on WLn+1, namely state B. This is because all the causes for the cell on WLn+1 being misread as being in state C, whether they be over-programming in the first place, or subsequent coupling from WLn+2 cell, are presently at work to induce stronger coupling effect induced by WLn+1 cell and experienced by WLn cell. Faced with this stronger coupling experienced by cell on WLn it may actually be better to apply the correction corresponding to WLn+1 cell being in state C, rather than state B. An alternative embodiment includes margining of read voltages during the read of step 670 of FIG. 17. This margining of the read of step 670 would be done with the intent of making coupling corrections for the read of step 670. But such an embodiment may be inferior to not making the coupling correction during read of step 670, as explained above.

In step 674, a read process is performed for the word line of interest WLn. This includes performing the process of FIG. 16 with VreadX=Vread1. In one embodiment, Vread1=Vread (e.g., 5.5 volts, or 6 volts, or another suitable value). Thus, all of the unselected word lines are receiving Vread. This provides the maximum compensation as the compensation is determined by the difference between Vread value used on WLn+1 now during read operations and the Vread value used earlier during the verify phase of program/verify. The compensation value, compC, can be defined as follows: compC=Vread1−VrdX. The results of step 674 are stored in the appropriate latches for bit lines with memory cells where neighbor cell WLn+1 was determined (in step 670) to be in state C. Therefore, the maximum compensation, CompC, is engaged for cells whose drain side neighbors had experienced the highest change in threshold voltage by being programmed from state E to state C. Note that these drain side neighbors were in State E during program/verify of WLn, but now are in State C. What has to be compensated for under all circumstances is the change in state of the drain side neighbor on WLn+1 experienced between the time of write of WLn and the present time of read of WLn. For other bit lines whose drain side neighbors are not being detected presently to be in state C, the data of this read of WLn which used Vread1 on WLn+1 will be disregarded.

In step 678, a read process is performed for WLn. During that read process, the drain side neighbor word line WLn+1 will receive Vread2. That is, VreadX=Vread2, where Vread2, as compared to Vread1, is closer in value to the VrdX used during programming. In one embodiment, Vread2 is 4.9 volts. This delivers a smaller compensation amount appropriate for cells whose drain side neighbors are now in state B. One example of a compensation amount is compB=Vread2−VrdX. In step 680, the results of step 678 will be stored for bit lines with memory cells having neighboring memory cells (e.g., WLn+1) in state B. Data for other bit lines will be disregarded.

In step 682, a read process is performed for WLn. During that read process, the drain side neighbor word line WLn+1 will receive Vread3. That is, VreadX=Vread3, where Vread3, as compared to Vread2, is closer in value to the VrdX used during programming. In one embodiment, Vread3 is 4.3 volts. This delivers a yet smaller compensation amount appropriate for cells whose drain side neighbors are now in state A. One example of a compensation amount is compA=Vread3−VrdX. In step 684, the results of step 682 will be stored for bit lines with memory cells having neighboring memory cells (e.g., WLn+1) in state A. Data for other bit lines will be disregarded.

In step 686, a read process is performed for WLn. During that read process, the drain side neighbor word line WLn+1 will receive Vread4. That is, VreadX=Vread4, where Vread4 is identical in value to Vrdx used during programming or closer the Vrdx than Vread3 (e.g., Vread4=3.7 v). This delivers no compensation amount which is appropriate for cells whose drain side neighbors are now in state E as they were at the time of program verify. In step 688, the results of step 686 will be stored for bit lines with memory cells having neighboring memory cells (e.g., WLn+1) in state E. Data for other bit lines will be disregarded. During the process of FIG. 17, the neighboring bit line will receive four voltages; however, each selected memory cell being read will only make us of the one appropriate voltage.

In different implementations, different values of Vread1, Vread2, Vread3 and Vread 4 can be determined based on device characterization, experimentation and/or simulation.

In the discussion above, the process of FIG. 17 is performed as part of the data recovery step 620 of FIG. 15. In another embodiment, the process of FIG. 17 can be used as the initial read process that is performed in response to a request to read data. For example, after receiving a request to read data in step 598 of FIG. 15, the system will perform a read operation in step 600. In this embodiment, step 600 is implemented by performing the process of FIG. 17. An embodiment that uses the process of FIG. 17 to implement step 600 may not have the additional data recovery step 620, so if an error is not correctable the system would report the error.

Figure 18:
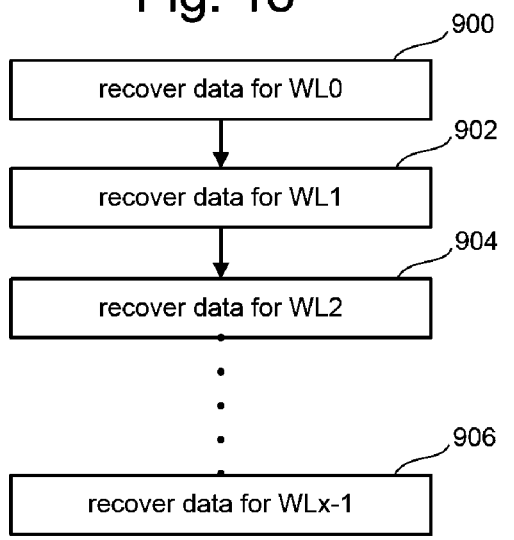
FIG. 18 is a flow chart describing one embodiment of a process for recovering data from multiple word lines.

FIG. 18 is a flow chart indicating that the data recovery process (the method of FIG. 17) can be performed for all the word lines of a block except for the last word line to be programmed. For example, if there are x+1 word lines, the recovery process can be used for word lines WL0 through WLx−1. It would not be necessary to perform the recovery process for word line WLx (e.g., the word line closest to the drain) because that word line has no neighbor that was programmed after it that would cause the floating gate to floating gate coupling effect. Although FIG. 18 shows an embodiment with a recovery process performed for all the word lines sequentially, in one embodiment described above with respect to FIG. 15, the recovery process can be performed for the word lines at separate times and only if there were ECC errors that were not correctable.

The above-described methods of FIGS. 16 and 17 were discussed with respect to the full sequence programming storing two bits of one logical page of FIG. 11. These processes can be slightly modified when reading data that was programmed according to the two-step process of FIG. 12 storing one bit from each of two logical pages. For example, when performing the standard read operation (step 600 of FIG. 15), reading the lower page would require applying Vra and Vrc to the control gates of the memory cells and sensing at those read points to determine whether the data is in state E/C (data 1) or states A/B (data 0) for the lower page. Thus, FIG. 16 would be modified by performing only steps 640, 642, 644 and steps 652-660 for a lower page read. For performing a read of the upper page, read compare point Vrb would be used to determine whether upper page data is for state E/A (data 1) or states B/C (data 0). Therefore, for an upper page read, the process of FIG. 16 would be amended to perform only steps 646, 648, 650, 658 and 660. Additionally, when recovering data (step 620), the process would perform the method of FIG. 19 for recovering data for a lower page and the process of FIG. 20 to recover data for an upper page.

Figure 19:
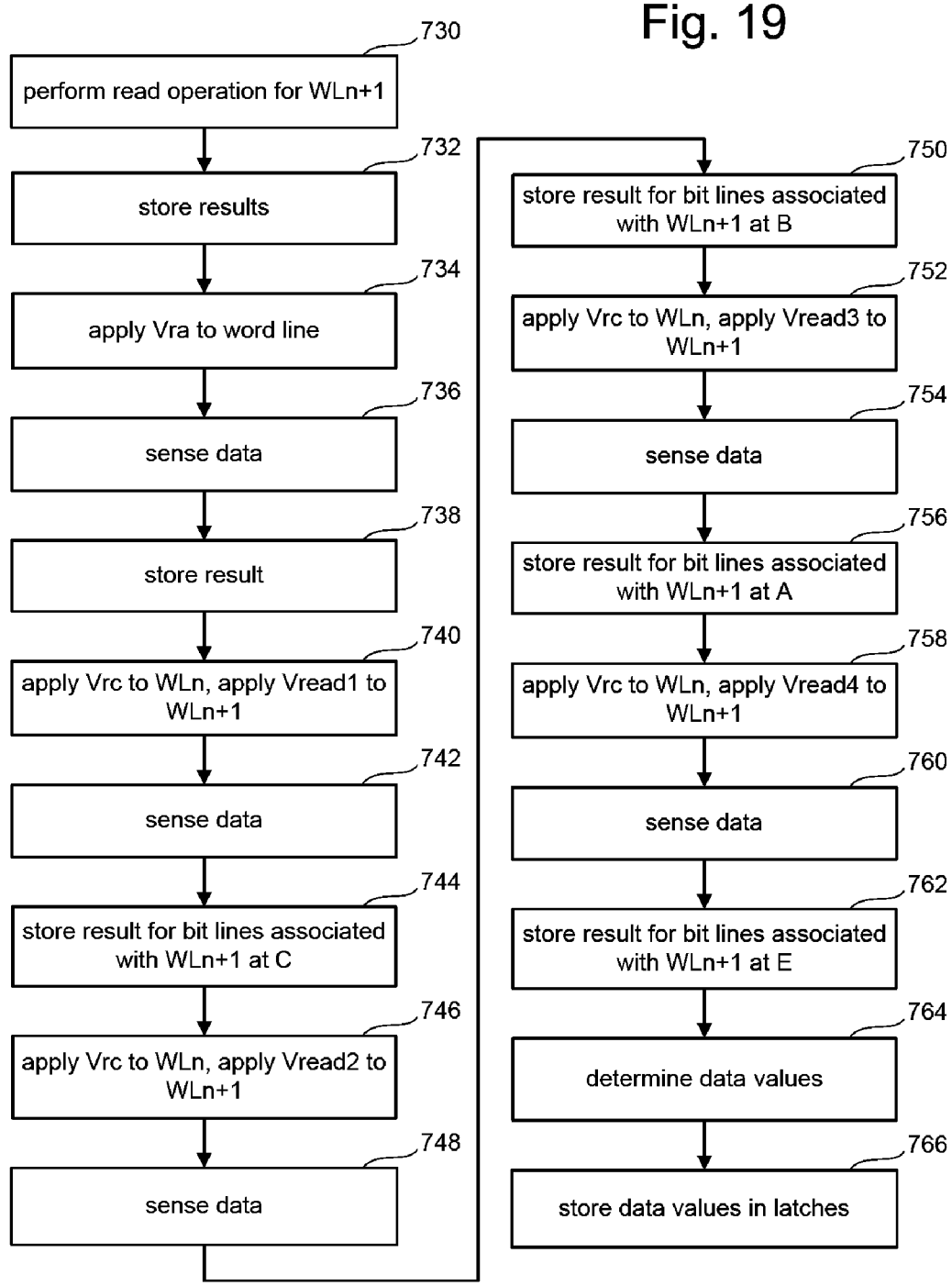
FIG. 19 is a flow chart describing one embodiment of a process for reading data from a lower page.

In step 730 of FIG. 19, a read operation is performed for the neighboring word line WLn+1 according to the method of FIG. 16. In some embodiments, the read operation performed for WLn+1 results in determining the actual data stored on WLn+1. In other embodiments, the read operation performed for WLn+1 results in a determination of charge levels (or another condition) on WLn+1, which may or may not accurately reflect the data stored on WLn+1. The results of that read operation are stored in the appropriate latches in step 732. In step 734, a read operation is performed for the word line of interest WLn, including performing the process of FIG. 10 with Vra being applied to WLn and VreadX=Vread4. In step 736, the data for the bit lines are sensed. In step 738, the results are stored in the appropriate latches. In another embodiment of step 734, the read process would be performed with VreadX=Vread1. In one embodiment, the value of VreadX in step 734 should be the same as used during the verification process.

In step 740, read reference voltage Vrc is applied to the word line WLn and a read operation is performed for the word line of interest WLn with VreadX=Vread1. In step 742, data is sensed as discussed above. In step 744, the results of the sense step 742 will be stored for bit lines associated with a neighboring cell storing data in state C.

In step 746, read reference voltage Vrc is applied to the word line WLn and a read operation is performed for the word line of interest WLn with VreadX=Vread2 for WLn+1. In step 948, the data will be sensed as discussed above. In step 950, the results of step 948 will be stored for bit lines associated with neighboring cells storing data in state B. Data for other bit lines will be discarded.

In step 752, read reference voltage Vrc is applied to the word line WLn and a read operation is performed for WLn with VreadX=Vread3 for WLn+1. In step 754, the data will be sensed as discussed above. In step 756, the results of step 754 will be stored for bit lines associated with neighboring cells storing data in state A. Data for other bit lines will be discarded.

In step 758, read reference voltage Vrc is applied to the word line WLn and a read operation is performed for WLn with VreadX=Vread4 for WLn+1. In step 760, the data will be sensed as discussed above. In step 762, the results of step 760 will be stored for bit lines associated with neighboring cells storing data in state E. Data for other bit lines will be discarded.

In step 764, processor 392 will determine the data values based on the data stored from the sensing steps. In step 766, the determined data values from step 764 will be stored in latches for eventual communication to the user requesting the read of data. In another embodiment, steps 734-738 associated with state A could be performed between steps 762 and 764. Other orders for performing the steps of FIG. 19, as well as the steps of other flow charts, can also be used.

Note that in the process described by FIG. 19, compensation is only applied for Vrc in order to distinguish state B from state C. It is assumed that compensation is not needed when reading at Vra because the usually negative threshold of the erase state, though affected by WLn+1, is separated sufficiently far from state A as to not need correction. While this is a practical assumption for current generation memories, it may not be true in future generation memories, and the compensation processes described with respect to Vrc may be used for Vra.

When determining the data values in step 764, if a memory cell conducts in response to Vra, the lower page data is "1." If the memory cell does not conduct in response to Vra and does not conduct in response to Vrc, then the lower page data is also "1." If the memory cell does not conduct in response to Vra, but does conduct in response to Vrc, then the lower page data is "0."

Figure 20:
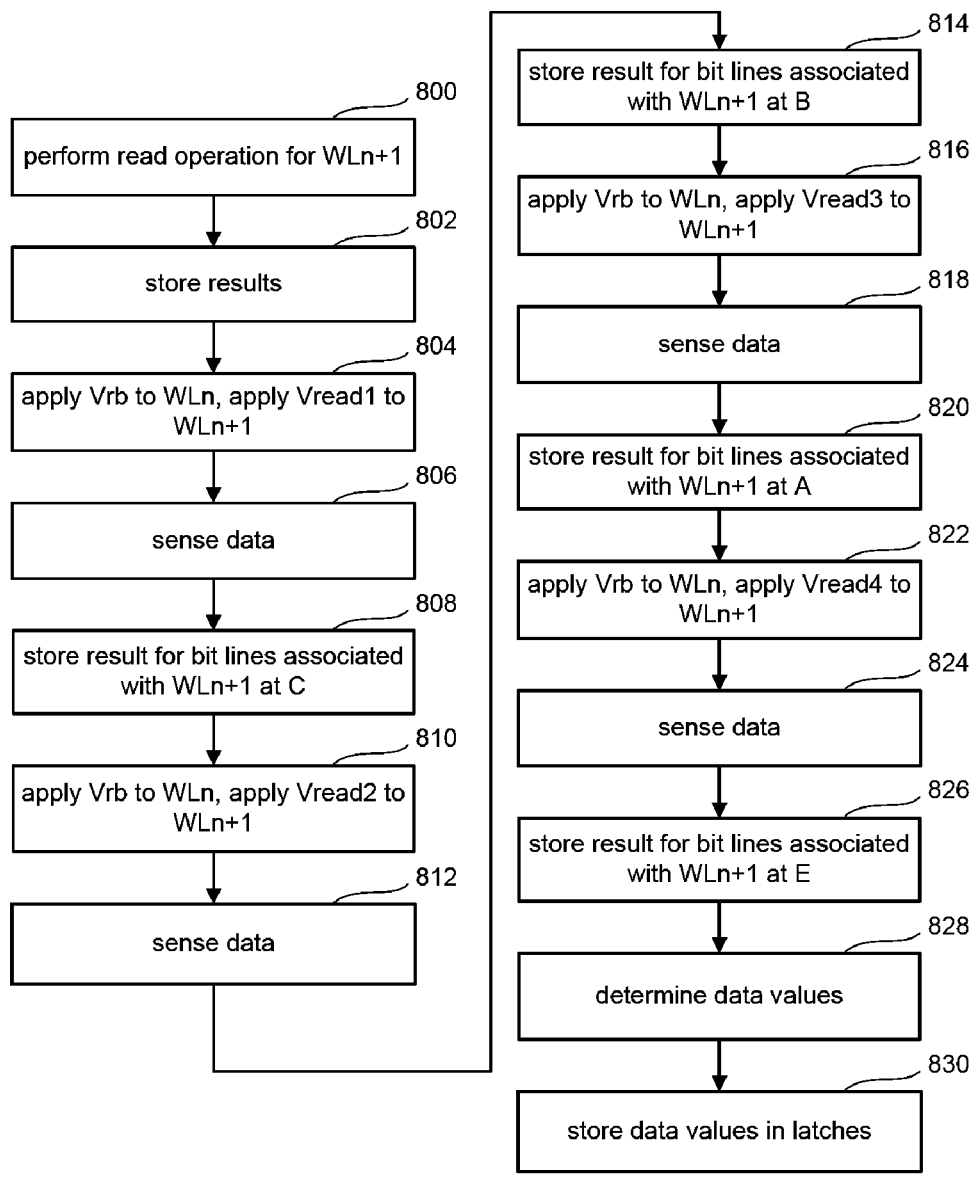
FIG. 20 is a flow chart describing one embodiment of a process of reading data from an upper page.

The process of FIG. 20 is used to read or recover data for the upper page. In step 800, a read operation is performed for the neighboring word line WLn+1 using the method of FIG. 16. In some embodiments, the read operation performed for WLn+1 results in determining the actual data stored on WLn+1. In other embodiments, the read operation performed for WLn+1 results in a determination of charge levels on WLn+1, which may or may not accurately reflect the data stored on WLn+1. In step 802, the results of step 800 are stored in the appropriate latches for each of the bit lines.

In step 804, read reference voltage Vrb is applied to the word line WLn and a read operation is performed for WLn with VreadX=Vread1 for WLn+1. In step 806, the data will be sensed as discussed above. In step 808, the results of step 806 will be stored for bit lines associated with neighboring cells storing data in state C. Data for other bit lines will be discarded.

In step 810, read reference voltage Vrb is applied to the word line WLn and a read operation is performed for WLn with VreadX=Vread2 for WLn+1. In step 812, the data will be sensed as discussed above. In step 814, the results of step 812 will be stored for bit lines associated with neighboring cells storing data in state B. Data for other bit lines will be discarded.

In step 816, read reference voltage Vrb is applied to the word line WLn and a read operation is performed for WLn with VreadX=Vread3 for WLn+1. In step 818, the data will be sensed as discussed above. In step 820, the results of step 818 will be stored for bit lines associated with neighboring cells storing data in state A. Data for other bit lines will be discarded.

In step 822, read reference voltage Vrb is applied to the word line WLn and a read operation is performed for WLn with VreadX=Vread4 for WLn+1. In step 824, the data will be sensed as discussed above. In step 826, the results of step 824 will be stored for bit lines associated with neighboring cells storing data in state E. Data for other bit lines will be discarded.

In step 828, processor 392 determines the data values based on the stored sensed data. If a memory cell turned on in response to Vrb, then the upper page data is "1." If a memory cell does not turn on in response to Vrb, then the upper page data is "0." In step 830, the data values determined by processor 392 are stored in the data latches for communication to the user.

In another embodiment, rather than using the methods of FIGS. 19 and 20 to recover data, the methods of FIGS. 19 and 20 can be used for the initial data reads performed in response to a request to read data. For example, after receiving a request to read data in step 598 of FIG. 15, the system will perform a read operation in step 600. In this embodiment, step 600 is implemented by performing the process of FIGS. 19 and/or 20. An embodiment that uses the process of FIGS. 19 and/or 20 to implement step 600 may not have the additional data recovery step 620, so if an error is not correctable the system would report the error.

FIGS. 19 and 20 are for reading data that are programmed using the upper page and lower page process of FIG. 12. These two methods of FIGS. 19 and 20 can be used to read data programmed by all bit line programming or odd/even bit line programming. When used with all bit line programming, all bit lines are typically read simultaneously. When used with odd/even bit line programming, even bit lines are typically read simultaneously at a first time and odd bit lines are typically read simultaneously possibly at a different time.

FIGS. 21-26 describe processes used to read data that is programmed according to the method associated with FIGS. 13A-C. The process of FIG. 21 can be implemented as an overall process for reading data that is performed in response to a read request for a particular one or more pages (or other grouping) of data prior to, separate from and/or in conjunction with using ECCs. In other embodiments, the process of FIG. 21 can be performed as part of data recovery step 620 of FIG. 15. When reading data as programmed according to the process of FIGS. 13A-C, any perturbation from floating gate to floating gate coupling due to programming the lower page of neighboring cells should be corrected when programming the upper page of the memory cell under question. Therefore, when attempting to compensate for floating gate to floating gate coupling effect from neighboring cells, one embodiment of the process need only consider the coupling effect due to the programming of the upper page of neighboring cells. Thus, in step 1060 of FIG. 21, the process reads upper page data for the neighboring word line. If the upper page of the neighboring word line was not programmed (step 1062), then the page under consideration can be read without compensating for the floating gate to floating gate coupling effect (step 1064). If the upper page of the neighboring word line was programmed (step 1062), then the page under consideration should be read using some compensation for the floating gate to floating gate coupling effect in step 1066. In some embodiments, the read operation performed for neighboring word line results in a determination of charge levels on the neighboring word line, which may or may not accurately reflect the data stored thereon. Also, note that the selected word line to be read, i.e. WLn, may itself have only lower page data. This can happen when the entire block has not yet been programmed. In such a situation it is always guaranteed that the cells on WLn+1 are still erased, and therefore, no coupling effect has yet plagued WLn cells. This means that no compensation is required. So the lower page read of a word line whose upper page has yet to be programmed can proceed as usual without the need for any compensation technique.

In one embodiment, a memory array implementing the programming process of FIGS. 13A-C will reserve a set of memory cells to store one or more flags. For example, one column of memory cells can be used to store flags indicating whether the lower page of the respective rows of memory cells has been programmed and another column of memory cells can be used to store flags indicating whether the upper page for the respective rows of memory cells has been programmed. In some embodiments, redundant cells can be used to store copies of the flag. By checking the appropriate flag, it can be determined whether the upper page for the neighboring word line has been programmed. More details about such a flag and the process for programming can be found in U.S. Pat. No. 6,657,891, Shibata et al., "Semiconductor Memory Device For Storing Multi-Valued Data," incorporated herein by reference in its entirety.

Figures 21, 25:
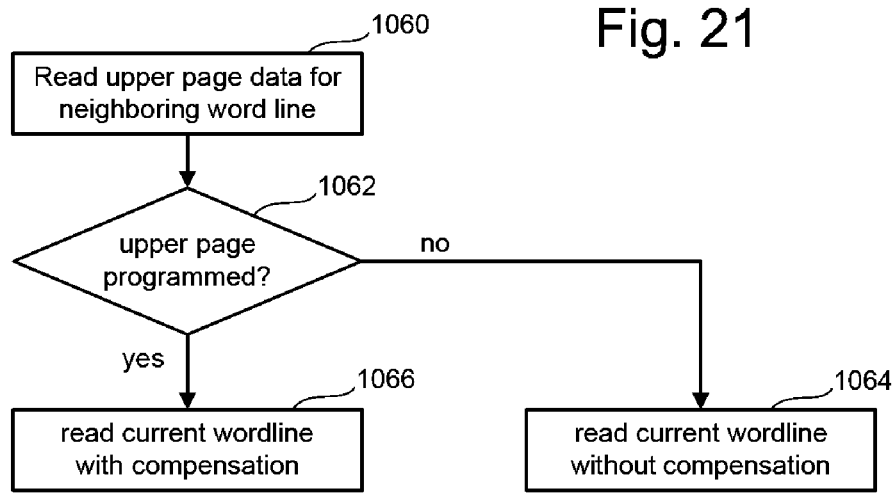
FIG. 21 is a flow chart describing one embodiment of a process for reading data.
FIG. 25 is a table depicting a process for determining data values.

FIG. 22 describes one embodiment of a process for reading the upper page data for a neighboring word line such as the drain side neighbor (step 1060 of FIG. 21). In step 1100, read reference voltage Vrc is applied to the word line associated with the page being read. At step 1102, the bit lines are sensed as described above. In step 1104, the results of step 1102 are stored in the appropriate latches. In step 1106, the system checks the flag indicating upper page programming associated with the page being read. In one embodiment, the memory cell storing the flag will store data in state E if the flag is not set and in state C if the flag is set. Therefore, when that particular memory cell is sensed at step 1102, if the memory cell conducts (turns on), then the memory cell is not storing data in state C and the flag is not set. If the memory cell does not conduct, then it is assumed in step 1106 that the memory cell is indicating that the upper page has been programmed.

In another embodiment, the flag can be stored in a byte. Rather than storing all bits in state C, the byte will include a unique 8-bit code representing the flag and known to the state machine 312, such that the 8-bit code has at least one bit in state E, at least one bit in state A, at least one bit in state B and at least one bit in state C. If the upper page has not been programmed, the byte of memory cells will all be in state E. If the upper page has been programmed, then the byte of memory cells will store the code. In one embodiment, step 1106 is performed by checking whether any of the memory cells of the byte storing the code do not turn on in response to Vrc. In another embodiment, step 1106 includes addressing and reading the byte of memory cells storing the flag and sending the data to the state machine, which will verify whether the code stored in the memory cells matches the code expected by the state machine. If so, the state machine concludes that the upper page has been programmed.

If the flag has not been set (step 1108), then the process of FIG. 22 terminates with the conclusion that the upper page has not been programmed. If the flag has been set (step 1108), then it is assumed that the upper page has been programmed and at step 1120 voltage Vrb is applied to the word line associated with the page being read. In step 1122, the bit lines are sensed as discussed above. In step 1124, the results of step 1122 are stored in the appropriate latches. In step 1126, voltage Vra is applied to the word line associated with the page being read. In step 1128, the bit lines are sensed. In step 1130, the results of step 1128 are stored in the appropriate latches. In step 1132, processor 392 determines the data value stored by each of the memory cells being read based on the results of the three sensing steps 1102, 1122 and 1128. At step 1134, the data values determined in step 1132 are stored in the appropriate data latches for eventual communication to the user. In step 1132, processor 392 determines the values of the upper page and lower page data using well known simple logic techniques dependent on the specific state coding chosen. For example, for the coding described in FIG. 13, the lower page data is Vrb* (the complement of the value stored when reading at Vrb), and the upper page data is Vra* OR (Vrb AND Vrc*).

In one embodiment, the process of FIG. 22 includes the application of Vread to the drain side neighboring word line. Therefore, VreadX=Vread for the process of FIG. 22. In another embodiment of the process of FIG. 22, VreadX=Vread4.

Figure 23:
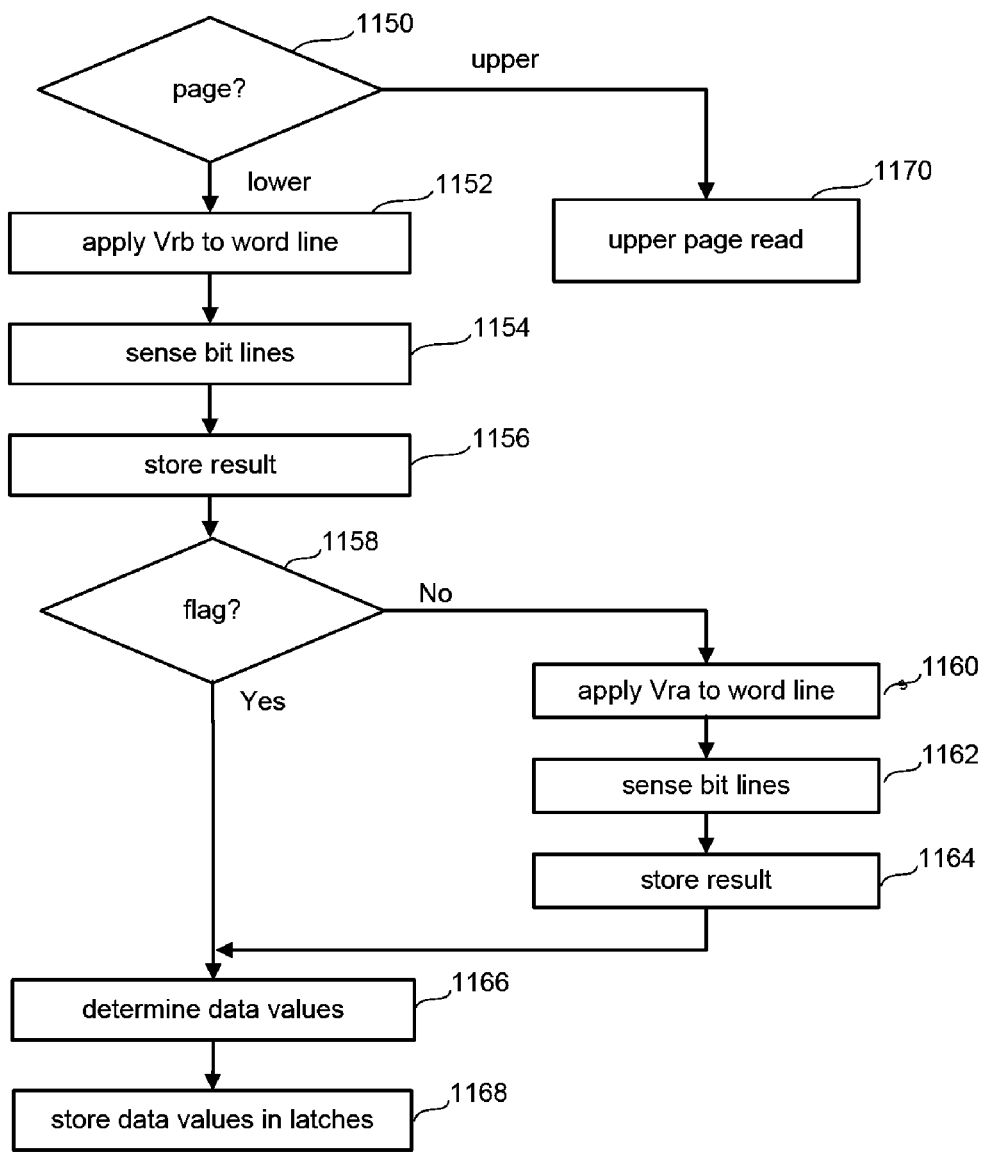
FIG. 23 is a flow chart describing one embodiment of a process for reading data without using compensation.

FIG. 23 is a flow chart describing one embodiment of a process for reading data of the word line under consideration when the system does not need to compensate for floating gate to floating gate coupling from a neighboring word line (see step 1064 of FIG. 21). In step 1150, it is determined whether the read is for the upper page or lower page associated with the word line under consideration. If the read is for the lower page, then in step 1152 voltage Vrb is applied to the word line associated with the page being read. In step 1154, the bit lines are sensed. In step 1156, the results of sensing step 1154 are stored in the appropriate latches. In step 1158, the flag is checked to determine if the page contains upper page data. If there is no flag, then any data present will be in the intermediate state and Vrb was the incorrect comparison voltage to use and the process continues at step 1160. In step 1160, Vra is applied to the word line, the bit lines are re-sensed at step 1162, and in step 1164 the result is stored. In step 1166 (after either step 1164, or step 1158 if the flag is set, processor 392 determines a data value to be stored. In one embodiment, when reading the lower page, if the memory cell turns on in response to Vrb (or Vra) being applied to the word line, then the lower page data is "1"; otherwise, the lower page data is "0."

If it is determined that the page address corresponds to the upper page (step 1150), an upper page read process is performed at step 1170. In one embodiment, the upper page read process of step 1170 includes the same method described in FIG. 22, which includes reading the flag and all three states since an unwritten upper page may be addressed for reading, or another reason.

In one embodiment, the process of FIG. 23 includes the application of Vread to the drain side neighboring word line. Therefore, VreadX=Vread for the process of FIG. 23. In another embodiment of the process of FIG. 22, VreadX=Vread4.

FIG. 24 depicts a flow chart describing one embodiment of a process for reading data while compensating for floating gate to floating gate coupling effect (see step 1066 of FIG. 21). In step 1200 of FIG. 24, the system determines whether to use compensation for the floating gate to floating gate coupling. This is performed separately for each bit line. The appropriate processor 392 will determine which bit lines need to use the compensation based on the data from the neighboring word lines. If a neighboring word line is in state E or B (or has charge apparently indicating state E or B), then the particular word line being read need not compensate for the floating gate to floating gate coupling effect. The assumption is that if it is in state E it hasn't contributed to any coupling because the threshold hasn't moved since the current word line was written. If it is in state B, it got there from B', and the movement from B' to B is small and can be neglected. In another embodiment, this small movement can be compensated for by the application of a proportionately small ΔVREAD.

In one embodiment, the process of step 1200 can be performed concurrently with step 1060. For example, FIG. 25 provides a chart explaining steps to perform a determination whether to use an offset for a particular bit line. The first step is to perform a read process using Vra on the word line. The second step is to perform a read using Vrb. When reading at Vra, a latch stores a 1 if the memory cell is in state E and a 0 if the memory cell is in states A, B, C or. When reading at Vrb, the latch will store a 1 for states E and A, and store a 0 for states B and C. The third step of FIG. 25 includes performing an XOR operation on the inverted results from the second step with the results from step 1. In the fourth step, a read is performed using Vrc at the word line. A latch stores a 1 for states E, A and B, and stores a 0 for state C. In the fifth step, the results of step 4 and step 3 are operated by a logical AND operation. Note that steps 1, 2 and 4 may be performed as part of FIG. 22. Steps 3 and 5 of FIG. 25 can be performed by dedicated hardware or by processor 392. The results of step 5 are stored in a latch with 1 being stored if no compensation is needed and 0 being stored if compensation is needed. Thus, a compensation will be required for those cells that are read on WLn that have neighboring memory cells on WLn+1 that are in the A or C state. This approach requires only one latch to determine whether to correct WLn or not, in contrast to some previous methods that store the full data from WLn+1, requiring two or more latches.

Looking back at step 1202 of FIG. 24, it is determined whether the page being read is the upper page or lower page. If the page being read is the lower page, then Vrb is applied to the word line WLn associated with the page being read and Vread4 is applied to the drain side neighbor word line WLn+1 during a read process in step 1204. Note that for the state coding described in FIG. 13, reading at Vrb is sufficient to determine the lower page data. In step 1208, the results of step 1206 are stored in the appropriate latches associated with the bit lines. In step 1210, Vrb will be applied to the word line WLn for the page being read and Vread3 is applied to the drain side neighbor word line WLn+1 during a read process (e.g., see FIG. 10). In step 1212, the bit lines are sensed. In step 1214, the results of the sensing of step 1212 are used to overwrite the results stored in step 1208 for the bit lines for which it was determined at step 1200 to use compensation. If the particular bit line is determined not to have to use compensation, then the data from step 1212 is not stored. In step 1216, processor 392 will determine whether the data is 1 or 0 for the lower page. If the memory cell turned on in response to Vrb, then the lower page data is 1; otherwise, the lower page data is 0. At step 1218, the lower page data is stored in the appropriate latches for communication to the user.

If it is determined at step 1202 that the page being read is the upper page, then the upper page correction process is performed at step 1220. FIG. 26 provides a flow chart describing the upper page correction process. In step 1250 of FIG. 26, read reference voltage Vrc is applied to the word line associated with the page being read and Vread4 is applied to the drain side neighbor word line WLn+1 as part of a read process. In step 1252, the bit lines are sensed. In step 1254, the results of the sensing step are stored in the appropriate latches. In step 1256, Vrc is applied to the word line associated with the page being read and Vread3 is applied to the drain side neighbor word line WLn+1 as part of a read process. In step 1258, the bit lines are sensed. In step 1260, the results of the sensing step 1258 are used to overwrite the results stored in step 1254 for any bit line for which the compensation is required (see step 1200).

At step 1270, Vrb is applied to the word line and Vread4 is applied to the drain side neighbor word line WLn+1 during a read process. In step 1272, the bit lines are sensed. In step 1274, the results of sensing step 1272 are stored. In step 1276, Vrb is applied to the word line associated with the page being read and Vread3 is applied to the drain side neighbor word line WLn+1 during a read process. In step 1278, the bit lines are sensed. In step 1280, the results of step 1278 are used to overwrite the results stored at step 1274 for those bit lines for which the compensation is required (see step 1200).

In step 1282, Vra is applied to the word line associated with the page being read and Vread4 is applied to the drain side neighbor word line WLn+1 as part of a read process. In step 1284, the bit lines are sensed. In step 1286, the results of the sensing step 1284 are stored in the appropriate latches. In step 1288, Vra is applied to the word line associated with the page being read and Vread3 is applied to the drain side neighbor word line WLn+1 as part of a read process. In step 1290, the bit lines are sensed. In step 1292, the results of step 1290 are used to overwrite the results stored in step 1286 for those bit lines for which the compensation is required (see step 1200). In step 1294, the processor 392 determines the data values in the same manner as previously described another method known in the art. In step 1296, the data values determined by the processor 392 are stored in the appropriate data latches for communication to the user. In other embodiments the order of reading (Vrc, Vrb, Vra) may be changed.

In the above discussion with respect to FIG. 21, an example is discussed involving the reading of a page of data. It is likely, but not required, that a request to read data will require the reading of multiple pages of data. In one embodiment, to speed up the process of reading multiple pages of data, the read process will be pipelined such that the state machine will execute a next page sensing while the user is transferring out the previous page of data. In such an implementation, the flag fetch process may interrupt the pipelined read process. To avoid such an interruption, one embodiment contemplates reading the flag for a given page when that page is read and using the wired-OR detection process to check the flag (rather than reading the flag and sending it to the state machine). For example, during step 1060 of FIG. 21 (reading the neighboring word line), the process first reads data using Vrc as the reference voltage. At that point, if the wired-OR line indicates that each state stores data 1, then the upper page has not been programmed; therefore, no compensation is needed and the system will read without compensating for the floating gate to floating gate coupling (step 1064). If the flag is a one-byte code that includes data in each data state, at least the flag memory cells would have data in state C if the flag is set. If the wired-OR line indicates that no memory cells have data in state C, then the state machine concludes that the flag has not been set; therefore, the upper page for the neighboring word line has not been programmed and compensation for floating gate coupling is not needed. More information about performing pipelined reads can be found in U.S. patent application Ser. No. 11/099,133, titled "Compensating for Coupling During Read Operations of Non-Volatile Memory," Inventor Jian Chen, filed on Apr. 5, 2005, incorporated herein by reference in its entirety.

Figure 27:
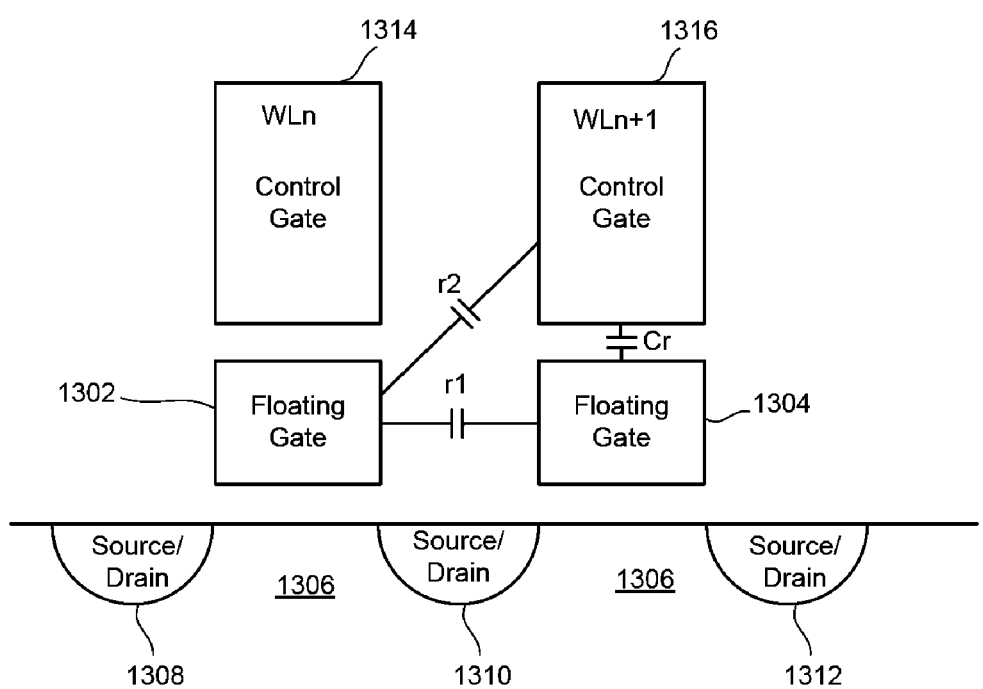
FIG. 27 is a block diagram showing capacitive coupling between two neighboring memory cells.

The above-described techniques help to reverse the effects of the floating gate to floating gate coupling. FIG. 27 graphically explains the concept of floating gate to floating gate coupling. FIG. 27 depicts neighboring floating gates 1302 and 1304, which are on the same NAND string. Floating gates 1302 and 1304 are situated above NAND channel/substrate 1306, which has source/drain regions 1308, 1310 and 1312. Above floating gate 1302 is control gate 1314 that is connected to and part of word line WLn. Above floating gate 1304 is control gate 1316 that is connected to and part of word line WLn+1. Although floating gate 1302 will likely be subject to coupling from multiple other floating gates, for simplicity FIG. 27 only shows the effects from one neighboring memory cell. Specifically, FIG. 27 shows three components of coupling provided to floating gate 1302 from its neighbor: r1, r2 and Cr. The component r1 is the coupling ratio between the neighboring floating gates (1302 and 1304), and is calculated as the capacitance of the neighboring floating gates divided by the sum of all capacitive couplings of floating gate 1302 to all the other electrodes surrounding it. The component r2 is the coupling ratio between the floating gate 1302 and the drain side neighbor control gate 1316, and is calculated as the capacitance of floating gate 1302 and control gate 1316 divided by the sum of all capacitive couplings of floating gate 1302 to all the other electrodes surrounding it. The component Cr is the control gate coupling ratio and is calculated as the capacitance between floating gate 1304 and its corresponding control gate 1316 divided by the sum of all capacitive couplings of floating gate 1302 to all the other electrodes surrounding it.

In one embodiment, the amount of required compensation, ΔVread, can be calculated as follows:

$$\Delta Vread = (\Delta VTn+1)\frac{1}{1+\frac{r2}{(r1)(Cr)}}$$

Where ΔVTn+1 is the change in threshold voltage of the drain side neighbor memory cell between the time of program/verify of WLn and the present time. ΔVTn+1, and r1 are the root causes of the word line to word line parasitic coupling effect that is mitigated by the present method. ΔVread is the compensation that is brought to bear in order to combat this effect.

Compensation for coupling described herein can be achieved by utilizing the same parasitic capacitance between neighboring floating gates as well as capacitance between the floating gate and the neighboring control gate. Since the control gate/floating gate stack is typically etched in one step, the compensation tracks the variations in spacing from memory cell to memory cell. Thus, when two neighbors are farther apart, the coupling is smaller and so will the required compensation for this effect be naturally smaller. When two neighbors are closer, the coupling is larger and so is compensation larger. This constitutes proportional compensation.

The above-described compensation also reduces the effects of variations in etch back depth. In some devices, the control gate partially wraps around the floating gate. The amount of overlap is called "etch back." Variations in etch back depth can effect the amount of coupling. With the above-described compensation scheme, the effect of the compensation will similarly vary with etch back depth.

As a result of the ability to reduce the effects of the floating gate to floating gate coupling, the margins between threshold voltage distributions can be made smaller or the memory system can program faster.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
a group of connected non-volatile storage elements; and
a managing circuit in communication with said group of connected non-volatile storage elements, said managing circuit applies a particular voltage to a particular non-volatile storage element of said group, while applying said particular voltage said managing circuit applies a first voltage to a first set of one or more non-volatile storage elements of said group and a second voltage to a second set of one or more non-volatile storage elements of said group, said first set of one or more non-volatile storage elements are on a first side of said particular non-volatile storage element and have already been subjected to one or more programming processes since a last erase of said group, said second set of one or more non-volatile storage elements are on a second side of said particular non-volatile storage element and have not already been subjected to a programming processes since said last erase of said group, while applying said particular voltage said managing circuit applies a voltage that is different than said second voltage to a neighbor non-volatile storage element of said group, said neighbor non-volatile storage element is next to said particular non-volatile storage element on said second side of said particular non-volatile storage element, said neighbor of said particular non-volatile storage element has not been subjected to programming since erasing said group, said managing circuit verifies programming of said particular non-volatile storage element based on said particular voltage.

2. A non-volatile storage system according to claim 1, wherein:
said second voltage is lower than said first voltage; and
said voltage that is different than said second voltage is greater than said second voltage and less than said first voltage.

3. A non-volatile storage system according to claim 1, wherein:
said particular voltage is a verify reference voltage;
said first voltage is sufficiently high enough to turn on said first set of non-volatile storage elements;
said second voltage is sufficiently high enough to turn on said second set of non-volatile storage elements; and
said second voltage is lower than said first voltage; and
said managing circuit verifies programming of said particular non-volatile storage element as part of an iteration of a programming process.

4. A non-volatile storage system according to claim 1, wherein:
said group of connected non-volatile storage elements is a NAND string.

5. A non-volatile storage system according to claim 4, wherein:
said first set of non-volatile storage elements are on a source side of said particular non-volatile storage element;
said second set of non-volatile storage elements are on a drain side of said particular non-volatile storage element; and
said neighbor non-volatile storage elements is on said drain side of said particular non-volatile storage element.

6. A non-volatile storage system according to claim 1, wherein:
said managing circuit reads data from said particular non-volatile storage element including applying a common read voltage to said first set of non-volatile storage elements and said second set of non-volatile storage elements, said reading includes applying a data dependent voltage to said neighbor non-volatile storage element based on a condition of said neighbor non-volatile storage element.

7. A non-volatile storage system according to claim 6, wherein:
said group of connected non-volatile storage elements is a NAND string;
said particular voltage is applied to a control gate for said particular non-volatile storage element;
said first voltage is applied to control gates for said first set of non-volatile storage elements;
said second voltage is applied to control gates for said second set of non-volatile storage elements; and
said voltage that is different than said second voltage is applied to a control gate for said neighbor non-volatile storage element.

8. A non-volatile storage system according to claim 7, wherein:
said second voltage is lower than said first voltage;
said particular voltage is a verify reference voltage;
said first voltage is sufficiently high enough to turn on said first set of non-volatile storage elements;
said second voltage is sufficiently high enough to turn on said second set of non-volatile storage elements; and
said second voltage is lower than said first voltage;
said first set of non-volatile storage elements are on a source side of said particular non-volatile storage element;
said second set of non-volatile storage elements are on a drain side of said particular non-volatile storage element; and
said neighbor non-volatile storage elements is on said drain side of said particular non-volatile storage element.

9. A non-volatile storage system according to claim 1, wherein:
said managing circuit selects a value of said voltage that is different than said second voltage based on how many non-volatile storage elements are in said second set.

* * * * *